US012751330B2

(12) United States Patent
Jo et al.

(10) Patent No.: US 12,751,330 B2
(45) Date of Patent: Sep. 29, 2026

(54) SEMICONDUCTOR PACKAGE

(71) Applicant: Samsung Electronics Co., Ltd., Suwon-si (KR)

(72) Inventors: Chajea Jo, Suwon-si (KR); Dohyun Kim, Suwon-si (KR); SeungRyong Oh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 471 days.

(21) Appl. No.: 18/356,325

(22) Filed: Jul. 21, 2023

(65) Prior Publication Data

US 2024/0170464 A1 May 23, 2024

(30) Foreign Application Priority Data

Nov. 17, 2022 (KR) ........................ 10-2022-0154674

(51) Int. Cl.
*H01L 23/34* (2006.01)
*H10W 20/20* (2026.01)
(Continued)

(52) U.S. Cl.
CPC ........... *H10W 90/00* (2026.01); *H10W 20/20* (2026.01); *H10W 70/65* (2026.01);
(Continued)

(58) Field of Classification Search
CPC ... H01L 25/16; H01L 23/3135; H01L 23/481; H01L 23/49822; H01L 23/49894; H01L 24/08; H01L 24/16; H01L 24/73; H01L 2224/08148; H01L 2224/16227; H01L 2224/16238; H01L 2224/24225; H01L 2224/73209; H01L 23/49816; H01L 2224/73204; H01L 2224/32225; H01L 24/13; H01L 23/5385; H01L 23/5383;
(Continued)

(56) References Cited

U.S. PATENT DOCUMENTS 8,169,058 B2 5/2012 Pagaila et al.
8,987,868 B1 3/2015 Rahman
(Continued)

FOREIGN PATENT DOCUMENTS

KR 10-2021-0142465 A 11/2021
KR 1020230033115 A 3/2023

*Primary Examiner* — Niki H Nguyen
(74) *Attorney, Agent, or Firm* — Wolf, Greenfield & Sacks, P.C.

(57) ABSTRACT

Disclosed is a semiconductor package including a substrate, a first semiconductor chip on the substrate and including a through via in the first semiconductor chip and a plurality of first bonding pads on an upper portion of the first semiconductor chip, a second semiconductor chip on the first semiconductor chip and including a plurality of second bonding pads on a lower portion of the second semiconductor chip, and a conductive post between a top surface of the substrate and a bottom surface of the second semiconductor chip and laterally spaced apart from the first semiconductor chip. The first bonding pads are in contact with the second bonding pads. A width in a first direction parallel to a plane defined by a bottom surface of the substrate of the second semiconductor chip is greater than a width in the first direction of the first semiconductor chip.

16 Claims, 13 Drawing Sheets

(51) Int. Cl.

| | |
|---|---|
| ***H10W 70/65*** | (2026.01) |
| ***H10W 70/685*** | (2026.01) |
| ***H10W 70/69*** | (2026.01) |
| ***H10W 74/10*** | (2026.01) |
| ***H10W 90/00*** | (2026.01) |
| *H10W 70/655* | (2026.01) |
| *H10W 72/00* | (2026.01) |

(52) U.S. Cl.
CPC ......... *H10W 70/685* (2026.01); *H10W 70/69* (2026.01); *H10W 74/121* (2026.01); *H10W 70/655* (2026.01); *H10W 72/853* (2026.01); *H10W 90/724* (2026.01); *H10W 90/792* (2026.01)

(58) Field of Classification Search
CPC ............. H01L 23/49827; H01L 25/105; H01L 23/147; H01L 24/81; H01L 25/0652; H01L 2924/15311; H01L 2224/97; H01L 2225/1058; H01L 23/5384; H01L 25/0655; H01L 2224/16225; H01L 2224/0401; H01L 21/486; H01L 2224/08145; H01L 25/0657; H01L 21/76898; H01L 2225/1023; H01L 2224/0557; H01L 2224/13025; H01L 2225/1035; H01L 2224/06181; H01L 21/563; H01L 2224/05569; H01L 2224/05547; H01L 2924/18161; H01L 2924/181; H01L 2224/81191; H01L 2225/06513; H01L 2225/06541; H01L 2225/06517; H01L 24/17; H01L 2224/80357; H01L 21/4857; H01L 21/565; H01L 2224/81
See application file for complete search history.

(56) References Cited

U.S. PATENT DOCUMENTS

| | | | | |
|---|---|---|---|---|
| 9,171,825 | B2 | 10/2015 | Park et al. | |
| 10,861,808 | B2 | 12/2020 | Chen et al. | |
| 2008/0128882 | A1 | 6/2008 | Baek et al. | |
| 2014/0225246 | A1 | 8/2014 | Henderson et al. | |
| 2015/0162265 | A1 | 6/2015 | Jo et al. | |
| 2020/0343223 | A1* | 10/2020 | Chen | H10P 72/74 |
| 2021/0118811 | A1* | 4/2021 | Lu | H10P 72/74 |
| 2021/0358875 | A1* | 11/2021 | Lee | H10W 74/117 |
| 2022/0093565 | A1 | 3/2022 | Radhakrishnan et al. | |
| 2023/0065366 | A1 | 3/2023 | Kim et al. | |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2022-0154674 filed on Nov. 17, 2022, in the Korean Intellectual Property Office, the disclosure of which is hereby incorporated by reference in its entirety.

BACKGROUND

The present inventive concepts relate to a semiconductor package, and more particularly, to a semiconductor package including a redistribution substrate.

A semiconductor package is provided to implement an integrated circuit chip to qualify for use in electronic products. A semiconductor package is typically configured such that a semiconductor chip is mounted on a printed circuit board and bonding wires or bumps are used to electrically connect the semiconductor chip to the printed circuit board. With the development of the electronics industry, various studies have been conducted to improve reliability and durability of semiconductor packages.

SUMMARY

Some embodiments of the present inventive concepts provide a semiconductor package whose electrical properties are improved.

According to some embodiments of the present inventive concepts, a semiconductor package may comprise: a substrate; a first semiconductor chip on the substrate, wherein the first semiconductor chip includes a through via in the first semiconductor chip and a plurality of first bonding pads on an upper portion of the first semiconductor chip; a second semiconductor chip on the first semiconductor chip, wherein the second semiconductor chip includes a plurality of second bonding pads on a lower portion of the second semiconductor chip; and a conductive post between a top surface of the substrate and a bottom surface of the second semiconductor chip and laterally spaced apart from the first semiconductor chip. The first bonding pads may be in contact with the second bonding pads. A width in a first direction parallel to a plane defined by a bottom surface of the substrate of the second semiconductor chip may be greater than a width in the first direction of the first semiconductor chip.

According to some embodiments of the present inventive concepts, a semiconductor package may comprise: a substrate; a first semiconductor chip on the substrate and including a through via in the first semiconductor chip, the first semiconductor chip having a first width in a first direction; a second semiconductor chip on the first semiconductor chip, the second semiconductor chip having a second width in the first direction; a first molding layer that surrounds the first semiconductor chip in a plan view; and a second molding layer that surrounds the second semiconductor chip in the plan view. The second width may be greater than the first width. A portion of a top surface of the first molding layer may be in contact with an entirety of a bottom surface of the second molding layer.

According to some embodiments of the present inventive concepts, a semiconductor package may comprise: a first redistribution substrate that includes a first dielectric layer, a first seed pattern, and a first conductive pattern on the first seed pattern, wherein the first dielectric layer includes a photo-imageable polymer; a solder ball on a bottom surface of the first redistribution substrate; a first semiconductor chip on a top surface of the first redistribution substrate and including a plurality of through vias in the first semiconductor chip, wherein the first semiconductor chip includes a plurality of bonding pads on an upper portion of the first semiconductor chip; a conductive post on the top surface of the first redistribution substrate and laterally spaced apart from the first semiconductor chip; a second semiconductor chip on a top surface of each of the first semiconductor chip and the conductive post and coupled to the through vias and the conductive post, wherein the second semiconductor chip includes a plurality of second bonding pads on a lower portion of the second semiconductor chip; a connection structure on the top surface of the first redistribution substrate and laterally spaced apart from the conductive post, the first semiconductor chip, and the second semiconductor chip; a first molding layer on the top surface of the first redistribution substrate, wherein the first molding layer is on sidewalls of the connection structure and surrounds the first semiconductor chip and the second semiconductor chip in a plan view; and a second redistribution substrate on the first molding layer and the connection structure. The second redistribution substrate may be coupled to the connection structure. The first bonding pads may be in contact with the second bonding pads. A width in a first direction of the second semiconductor chip may be greater than a width in the first direction of the first semiconductor chip. The first direction may be parallel to the bottom surface of the first redistribution substrate.

DETAILED DESCRIPTION OF EMBODIMENTS

Figure 1:
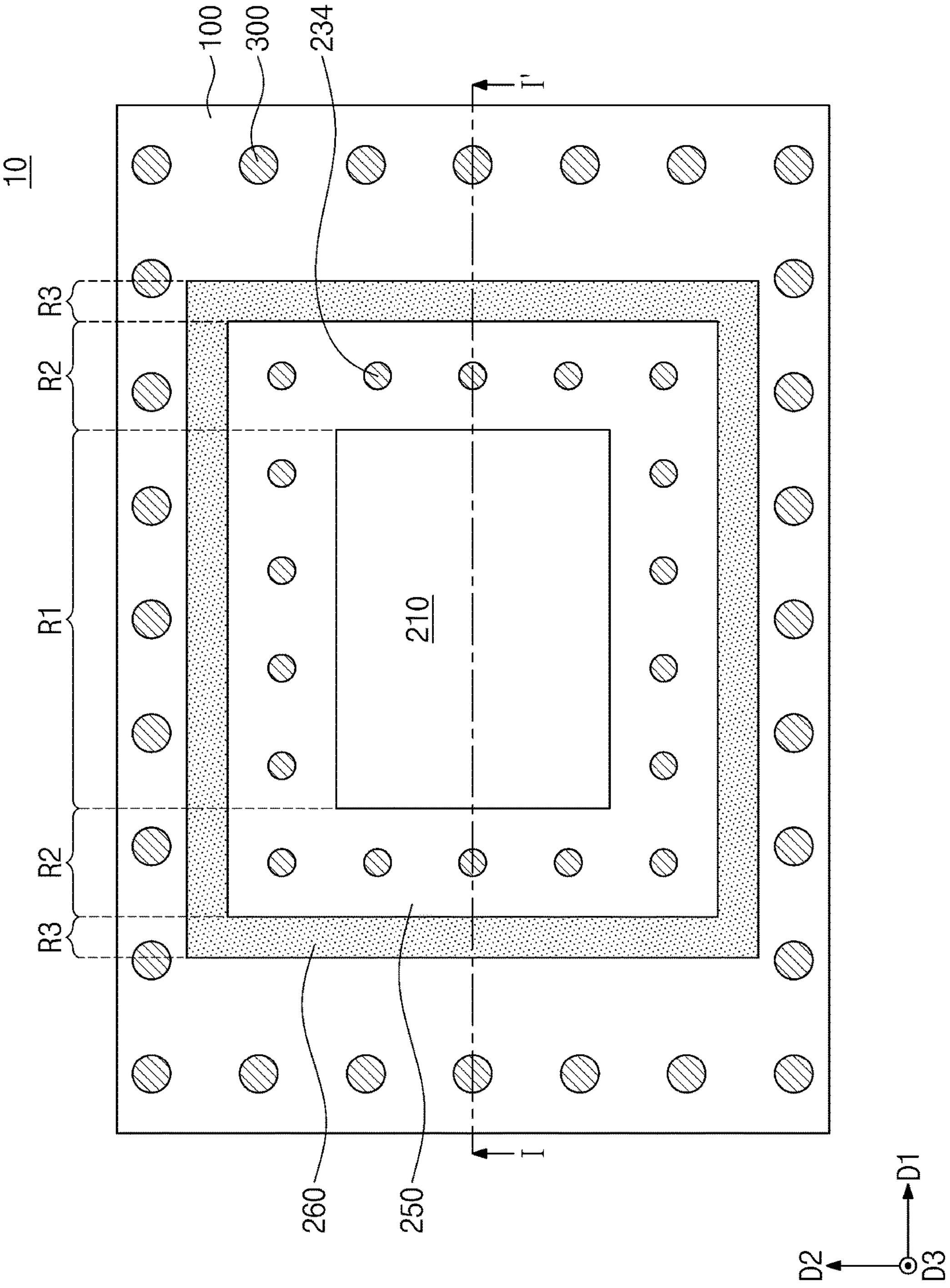
FIG. 1 is a plan view illustrating a semiconductor package according to some embodiments of the present inventive concepts.

Hereinafter, embodiments will be described in detail with reference to the accompanying drawings. In this description, like reference numerals may indicate like components. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination. The following will now describe a semiconductor package and its fabrication method according to the present inventive concepts.

Figure 2:
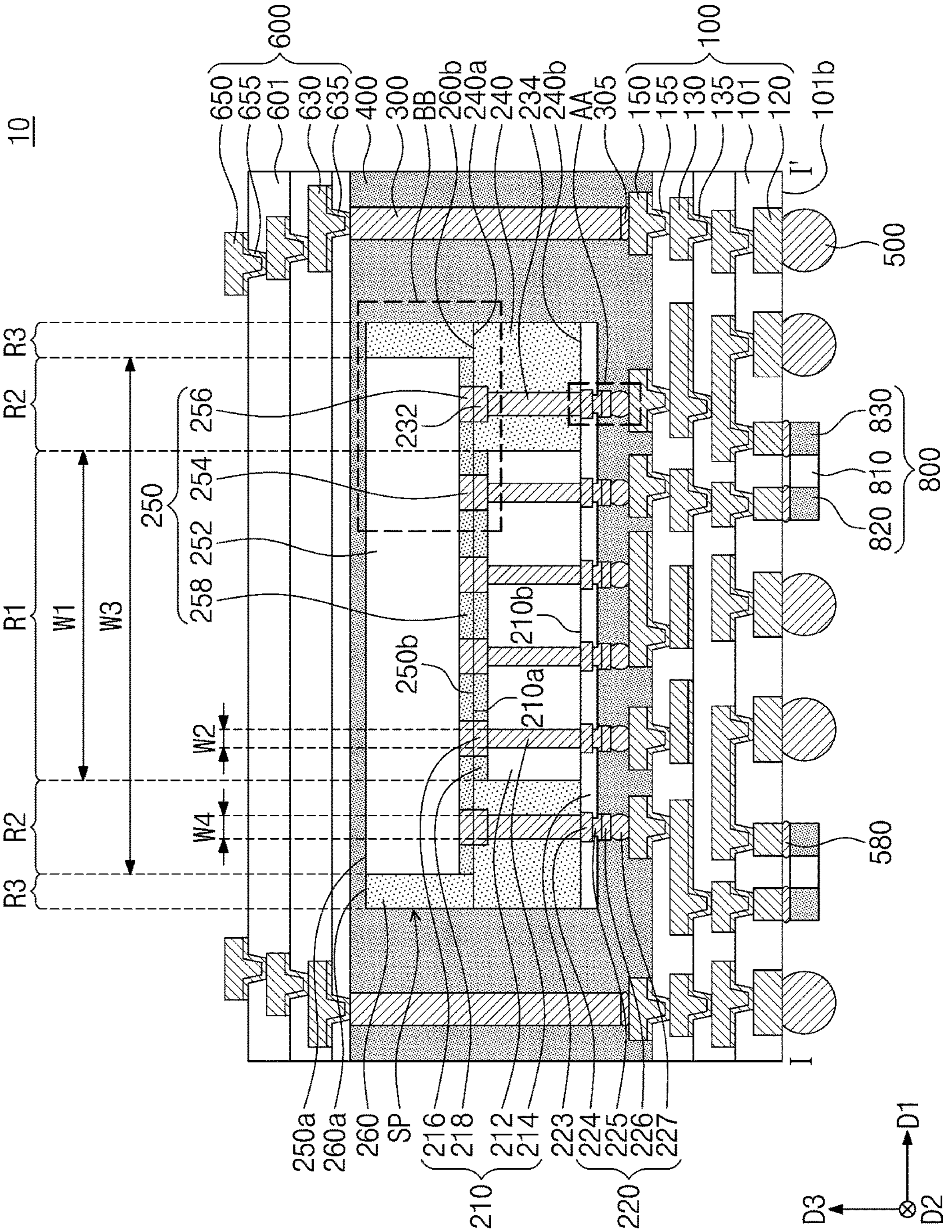
FIG. 2 is a cross-sectional view taken along line I-I' of FIG. 1, illustrating a semiconductor package according to some embodiments of the present inventive concepts.
Figure 3A:
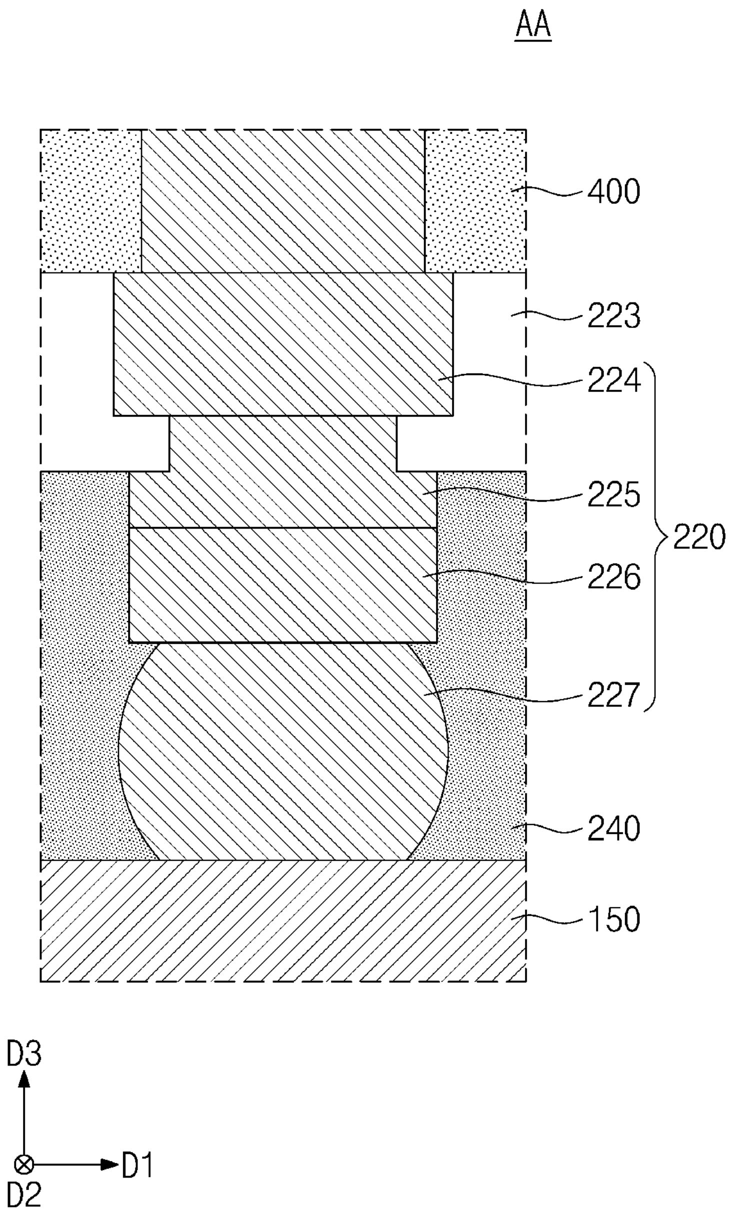
FIG. 3A is an enlarged view illustrating section AA of FIG. 2.
Figure 3B:
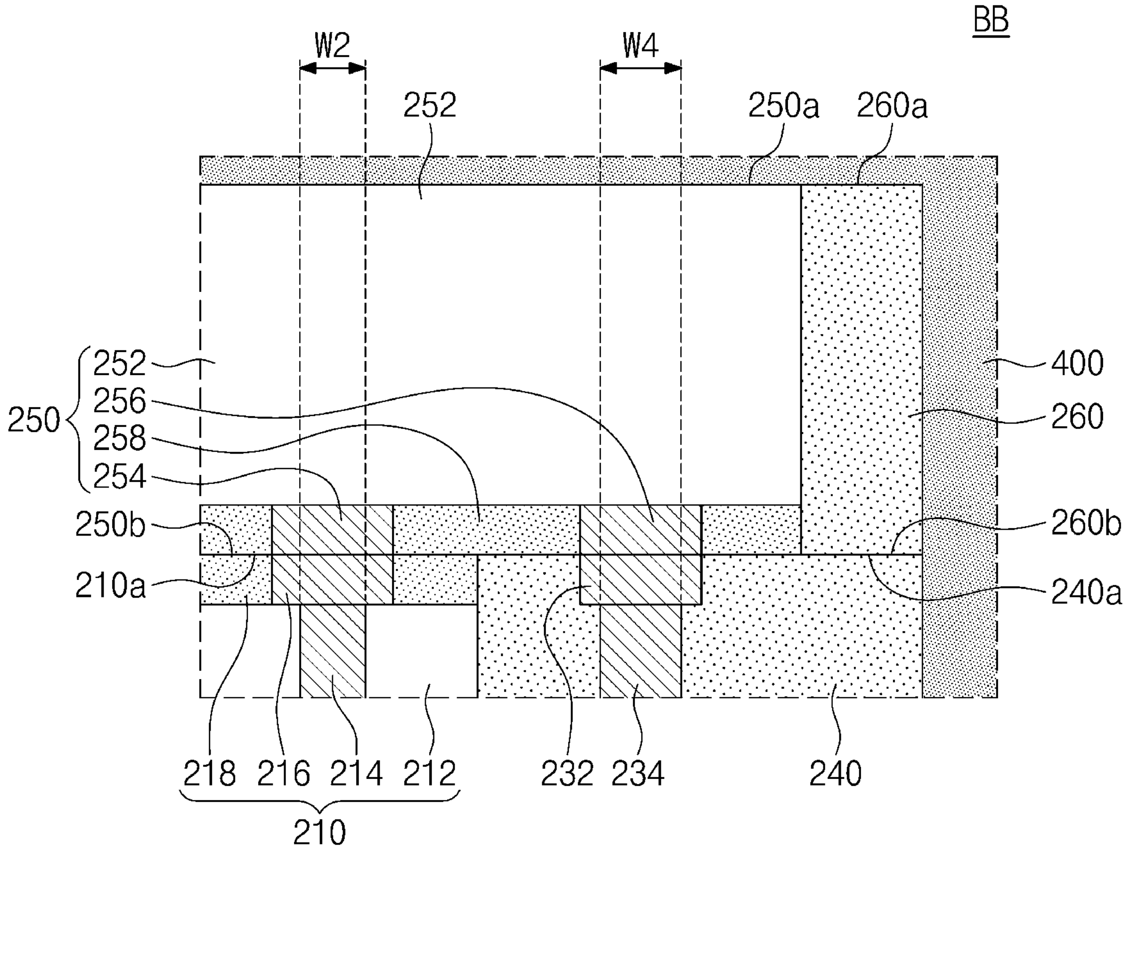
FIG. 3B is an enlarged view illustrating section BB of FIG. 2.

FIG. 1 is a plan view illustrating a semiconductor package according to some embodiments of the present inventive concepts. FIG. 2 is a cross-sectional view taken along line I-I' of FIG. 1, illustrating a semiconductor package according to some embodiments of the present inventive concepts. FIG. 3A is an enlarged view illustrating section AA of FIG. 2. FIG. 3B is an enlarged view illustrating section BB of FIG. 2.

Referring to FIGS. 1 and 2, a semiconductor package 10 may include a first redistribution substrate 100, external connection terminals 500, a passive element 800, a sub-semiconductor package SP, a connection structure 300, a third molding layer 400, and a second redistribution substrate 600.

The first redistribution substrate 100 may include a first dielectric layer 101, under-bump patterns 120, first redistribution patterns 130, first seed patterns 135, first seed pads 155, and first redistribution pads 150. The first redistribution substrate 100 may be a redistribution layer or a printed circuit board. The first redistribution substrate 100 may be called a substrate.

The first dielectric layer 101 may include an organic material, such as a photo-imageable dielectric (PID) material. The photo-imageable dielectric material may be a polymer. The photo-imageable dielectric material may include one or more materials, such as, for example, photosensitive polyimide, polybenzoxazole, phenolic polymers, and/or benzocyclobutene polymers. The first dielectric layer 101 may be provided in plural. The number of stacked first dielectric layers 101 may be variously changed. For example, the plurality of first dielectric layers 101 may include the same material as each other. An indistinct interface may be provided between neighboring first dielectric layers 101.

A first direction D1 may be parallel to a bottom surface 101*b* of a lowermost one of the first dielectric layers 101, which may be referred to as a bottom surface of the first redistribution substrate 100. A second direction D2 may be parallel to the bottom surface 101*b* of the lowermost first dielectric layer 101 and orthogonal to the first direction D1. A third direction D3 may be perpendicular to the bottom surface 101*b* of the lowermost first dielectric layer 101.

The under-bump patterns 120 may be provided in the lowermost first dielectric layer 101. The under-bump patterns 120 may have their bottom surfaces exposed by the lowermost first dielectric layer 101. The under-bump patterns 120 may serve as pads for the external connection terminals 500. The under-bump patterns 120 may be laterally spaced apart and electrically insulated from each other. The phrase "two components are laterally spaced apart from each other" may mean "two components are horizontally spaced apart from each other." The language "horizontally" may mean "parallel to the second direction D2." The first redistribution substrate 100 may have a bottom surface constituted by the bottom surface 101*b* of the lowermost dielectric layer 101 and the bottom surfaces of the under-bump patterns 120. The under-bump patterns 120 may include a metallic material, such as copper.

The first redistribution patterns 130 may be provided on and electrically connected to the under-bump patterns 120. The first redistribution patterns 130 may be laterally spaced apart and electrically separated from each other. The first redistribution patterns 130 may include metal, such as copper. The phrase "electrically connected to the first redistribution substrate 100" may include the meaning that "electrically connected to the first redistribution patterns 130 and/or the under-bump patterns 120."

Each of the first redistribution patterns 130 may include a first via part and a first wire part. The first via part may be provided in a corresponding first dielectric layer 101. The first wire part may be provided on the first via part, and the first wire part and the first via part may be connected to each other with no interface therebetween. A width of the first wire part may be greater than that of the first via part. The first wire part may extend onto a top surface of a corresponding first dielectric layer 101. In this description, the component "via" may be an element for vertical (D3 direction) connection, and the component "wire" may be an element for horizontal connection (D2 direction). The term "vertical" may indicate "parallel to the third direction D3."

The first redistribution patterns 130 may include lower redistribution patterns and upper redistribution patterns that are stacked on each other. The lower redistribution patterns may be disposed on the under-bump patterns 120. The upper redistribution patterns may be correspondingly disposed on and coupled to the lower redistribution patterns.

The first seed patterns 135 may be correspondingly disposed on bottom surfaces of the first redistribution patterns 130. For example, each of the first seed patterns 135 may be on and at least partially cover a bottom surface of the first wire part included in a corresponding first redistribution pattern 130, and may also be on and at least partially cover a bottom surface and a sidewall of the first via part included in the corresponding first redistribution pattern 130. Each of the first seed patterns 135 may not extend onto a sidewall of the first wire part included in the corresponding first redistribution pattern 130. The first seed patterns 135 may include a metallic material different from that of the under-bump patterns 120 and that of the first redistribution patterns 130. For example, the first seed patterns 135 may include copper, titanium, and/or any alloy thereof. The first seed patterns 135 may serve as barrier layers to reduce or prevent diffusion of materials included in the first redistribution patterns 130.

The first redistribution pads 150 may be disposed on the upper redistribution patterns of the first redistribution patterns 130 to be coupled to the first redistribution patterns 130. The first redistribution pads 150 may be laterally spaced apart from each other. The first redistribution pads 150 may be coupled through corresponding first redistribution patterns 130 to corresponding under-bump patterns 120. As the first redistribution patterns 130 are provided, at least one first redistribution pad 150 may not be vertically aligned with the under-bump pattern 120 electrically connected to the at least one first redistribution pad 150. Accordingly, it may be possible to more freely design an arrangement of the first redistribution pads 150. The number of the first redistribution patterns 130 stacked between the under-bump patterns 120 and the first redistribution pads 150 may be variously changed without being limited to the embodiments shown.

The first redistribution pads 150 may be provided in and on an uppermost (D3 direction) first dielectric layer 101. A lower portion of each of the first redistribution pads 150 may be disposed in the uppermost first dielectric layer 101. An upper portion of each of the first redistribution pads 150 may extend onto a top surface of the uppermost first dielectric layer 101. The first redistribution pads 150 may include metal, such as copper. The first redistribution pads 150 may further include nickel, gold, and/or any alloy thereof.

The first seed pads 155 may be correspondingly provided on bottom surfaces of the first redistribution pads 150. The first seed pads 155 may be correspondingly provided between the first redistribution pads 150 and the upper redistribution patterns of the first redistribution patterns 130, and may extend between the uppermost first dielectric layer 101 and the first redistribution pads 150. The first seed pads 155 may include a metallic material different from that of the first redistribution pads 150.

The external connection terminals 500 may be attached onto the bottom surface of the first redistribution substrate 100. For example, the external connection terminals 500 may be correspondingly disposed on the bottom surfaces of the under-bump patterns 120 to be coupled to the under-bump patterns 120. The external connection terminals 500 may be electrically connected through the under-bump patterns 120 to the first redistribution patterns 130. The external connection terminals 500 may be laterally spaced apart and electrically separated from each other. The external connection terminal 500 may include a solder material. The solder material may include, for example, tin, bismuth, lead, silver, and/or any alloy thereof. The external connection terminals 500 may include a single solder ball, a ground solder ball, and a power solder ball.

The passive element 800 may be mounted on the bottom surface of the first redistribution substrate 100. The passive element 800 may be disposed laterally spaced apart from the external connection terminals 500. The passive element 800 may have a bottom surface located at a higher level (D3 direction) than that of lowermost surfaces of the external connection terminals 500. Therefore, when the external connection terminals 500 of the semiconductor package 10 are combined with a board, the passive element 800 may be spaced apart from the board. Accordingly, the semiconductor package 10 may be favorably mounted on the board. A level of a certain component may indicate a vertical level. A difference in level between two components may be measured in the third direction D3.

The passive element 800 may be, for example, a capacitor. In other embodiments, the passive element 800 may be an inductor or a resistor. The passive element 800 may include a first conductive terminal 830, a second conductive terminal 820, and an insulator 810. The first conductive terminal 830 and the second conductive terminal 820 may respectively be a first electrode and a second electrode. The second conductive terminal 820 may be spaced apart from the first conductive terminal 830. The insulator 810 may be provided between the first conductive terminal 830 and the second conductive terminal 820.

A structure and components of the passive element 800 may be variously changed without being limited to that shown. For example, the passive element 800 may include an integrated stack capacitor (ISC). In this embodiment, a stack structure (not shown) may be disposed in the insulator 810. The stack structure may include a plurality of conductive layers and a plurality of dielectric layers correspondingly disposed between the conductive layers.

Solder connectors 580 may be provided between the first conductive terminal 830 and the under-bump pattern 120 and between the second conductive terminal 820 and a corresponding under-bump pattern 120. The solder connectors 580 may be spaced apart and electrically separated from each other. The first conductive terminal 830 may be electrically connected to a corresponding under-bump pattern 120 through one of the solder connectors 580. For example, the first conductive terminal 830 may be electrically connected through the first redistribution substrate 100 to one of the external connection terminals 500. The one of the external connection terminals 500 may be a power solder ball. Therefore, a voltage may be applied to the first conductive terminal 830. The voltage may be a ground voltage or a power voltage.

The second conductive terminal 820 may be electrically connected to the first redistribution substrate 100 through another of the solder connectors 580. For example, the second conductive terminal 820 may be electrically connected through the first redistribution patterns 130 to a corresponding first redistribution pad 150. Therefore, an external voltage may be applied through the external connection terminal 500 to the passive element 500, and a voltage output from the passive element 800 may be transferred to the first redistribution pad 150 electrically connected to the passive element 800.

The sub-semiconductor package SP may be disposed on a top surface of the first redistribution substrate 100. The sub-semiconductor package SP may include a first semiconductor chip 210, a bump structure 220, a second semiconductor chip 250, a conductive post 234, a first molding layer 240, and a second molding layer 260.

The first semiconductor chip 210 may be mounted on the top surface 100*a* of the first redistribution substrate 100. For example, the first semiconductor chip 210 may be a logic chip or a buffer chip. The logic chip may include an applicant specific integrated circuit (ASIC) chip or an application processor (AP) chip. The ASIC chip may include an application specific integrated circuit (ASIC). In other embodiments, the logic chip may include a central processing unit (CPU) or a graphic processing unit (GPU). Dissimilarly, the first semiconductor chip 210 may be a memory chip. The first semiconductor chip 210 may have a first width W1. The first width W1 may be width in the first direction D1 or the second direction D2.

The first semiconductor chip 210 may include a first body 212, through vias 214, first bonding pads 216, and a first passivation layer 218. The first body 212 may include a semiconductor substrate and an integrated circuit.

The through vias 214 may be provided in the first body 212. The through vias 214 may penetrate the first body 212. The through vias 214 may be electrically connected to integration circuits of the first body 212. The through vias 214 may include signal through vias, ground through vias, and power through vias. The through vias 214 may each have a second width W2. The second width W2 may be a width in the first direction D1 or the second direction D2.

The first bonding pads 216 may be provided on a top surface of the first body 212. The first bonding pads 216 may be coupled to corresponding through vias 214 to come into electrical connection with integrated circuits of the first body 212. The first bonding pads 216 may include a metallic material, such as copper. The expression "two components are electrically connected to each other" may include the meaning that "two components are electrically directly connected to each other or indirectly connected to each other through other component(s)."

The first passivation layer 218 may be provided on the top surface of the first body 212. The first passivation layer 218 may be on and at least partially cover lateral surfaces of the first bonding pads 216. The first passivation layer 218 may expose top surfaces of the first bonding pads 216. The first passivation layer 218 may have a top surface coplanar with those of the first bonding pads 216. The first passivation layer 218 may have a lateral surface linearly aligned with that of the first body 212. The first passivation layer 218 may include a dielectric material, such as silicon oxide.

The first molding layer 240 may border or surround the first semiconductor chip 210 in a plan view. For example, the first molding layer 240 may extend along a lateral surface of the first semiconductor chip 210, and may expose a top surface 210*a* and a bottom surface 210*b* of the first semiconductor chip 210. The first molding layer 240 may have a top surface 240*a* coplanar with the top surface 210*a* of the first semiconductor chip 210. The first molding layer 240 may have a bottom surface 240*b* coplanar with the bottom surface 210*b* of the first semiconductor chip 210. The first molding layer 240 may include a dielectric polymer, such as an epoxy-based molding compound and a filler such as silicon oxide, silicon carbide, or alumina.

Referring to FIGS. 2 and 3A, a passivation pattern 223 and the bump structure 220 may be provided below the first semiconductor chip 210. The bump structure 220 may include bump pads 224, barrier patterns 225, bonding patterns 226, and solder bumps 227.

The passivation pattern 223 may be provided below the first semiconductor chip 210 and the first molding layer 240. The passivation pattern 223 may be on and at least partially cover the bottom surface 210*b* of the first semiconductor chip 210 and the bottom surface 240*b* of the first molding layer 240. The passivation pattern 223 may partially expose bottom surfaces of the bump pads 224, which will be described below. The passivation pattern 223 may include a dielectric material, such as silicon nitride, silicon oxide, and/or silicon oxynitride.

The bump pads 224 may be provided below the through vias 214. The bump pads 224 may also be provided below the conductive posts 234 which will be described below. The bottom surfaces of the bump pads 224 may be located at a higher level (D3 direction) than that of a bottom surface of the passivation pattern 223. The bump pads 224 may be electrically connected to the through vias 214 and the conductive vias 234 which will be described below. The bump pads 224 may include a metallic material, such as aluminum.

The barrier patterns 225 may be provided below the bump pads 224. The barrier patterns 225 may have their bottom surfaces located at a lower level (D3 direction) than that of the bottom surface of the passivation pattern 223. The barrier patterns 225 may be electrically connected to the bump pads 224. The barrier patterns 225 may include a metallic material, such as copper.

The bonding patterns 226 may be provided below the barrier patterns 225. The bonding patterns 226 may be electrically connected to the barrier patterns 225. The bonding patterns 226 may include a metallic material, such as nickel.

The solder bumps 227 may be provided below the bonding patterns 226. The solder bumps 227 may be interposed between the first redistribution pads 150 and the bonding patterns 226. The solder bumps 227 may be electrically connected to the first redistribution pads 150 and the bonding patterns 226. The solder bumps 227 may include a solder material. The solder material may include, for example, tin, bismuth, lead, silver, and/or any alloy thereof.

Referring back to FIGS. 1 and 2, the second semiconductor chip 250 may be disposed on the first semiconductor chip 210. The second semiconductor chip 250 may be of a different type from the first semiconductor chip 210. The second semiconductor chip 250 may be a logic chip or a buffer chip. In other embodiments, the second semiconductor chip 250 may be a memory chip. The second semiconductor chip 250 may include a second body 252, second bonding pads 254, third bonding pads 256, and a second passivation layer 258. The second semiconductor chip 250 may have a third width W3. The third width W3 may be a width in the first direction D1 or the second direction D2. The third width W3 may be greater than the first width W1.

The second molding layer 260 may border or surround the second semiconductor chip 250 in a plan view. For example, the second molding layer 260 may extend along a lateral surface of the second semiconductor chip 250, and may expose a top surface 250*a* and a bottom surface 250*b* of the second semiconductor chip 250.

The sub-semiconductor package SP may have a first region R1, a second region R2, and a third region R3. The first region R1 may be constituted by an area that the first semiconductor chip 210 occupies and an area that vertically overlaps the first semiconductor chip 210. For example, when viewed in plan, the first region R1 may be a central region of the second semiconductor chip 250. The second region R2 may be constituted by an edge region of the second semiconductor chip 250 and an area that vertically overlaps the edge region. The second region R2 may border or surround the first region R1 in a plan view. The third region R3 may be constituted by an area of the third molding layer 260 that borders or surrounds the lateral surface of the second semiconductor chip 250 in a plan view and an area that overlaps the surrounding area of the third molding layer 260. The third region R3 may border or surround the second region R2 in a plan view. When viewed in plan, neither the second region R2 nor the third region R3 may overlap the first semiconductor chip 200. When viewed in plan, the third region R3 may not overlap the second region R2.

The second body 252 may include a semiconductor substrate and an integrated circuit. The second bonding pads 254 may be provided on a bottom surface of the second body 252. The second bonding pads 254 may be provided in the first region R1. The first and second bonding pads 216 and 254 may include metal, such as copper, tungsten, aluminum, nickel, and/or tin. For example, the first and second bonding pads 216 and 254 may include copper (Cu). The first bonding pads 216 may be in contact with the second bonding pads 254. The first bonding pad 216 and the second bonding pad 254 may constitute a single unitary or monolithic shape with no interface therebetween. Although the first and second bonding pads 216 and 254 are illustrated to have their sidewalls linearly aligned with each other, embodiments of the present inventive concepts are not limited thereto, and when viewed in plan, the first and second bonding pads 216 and 254 may have their sidewalls spaced apart from each other.

The third bonding pads 256 may be provided on the bottom surface of the second body 252. The third bonding pads 256 may be provided in the second region R2. The third bonding pads 256 may include metal, such as copper, tungsten, aluminum, nickel, and/or tin. For example, the third bonding pads 256 may include copper.

The second passivation layer 258 may be provided below the second body 252. The second passivation layer 258 may be on and at least partially cover lateral surfaces of the second bonding pads 254 and lateral surfaces of the third bonding pads 256. The second passivation layer 258 may expose bottom surfaces of the second bonding pads 254 and bottom surfaces of the third bonding pads 256. The second passivation layer 258 may have a bottom surface coplanar with those of the second bonding pads 254 and those of the third bonding pads 256. The second passivation layer 258 may be in contact with the first passivation layer 218 on the first region R1. The second passivation layer 258 may be in contact with the first molding layer 240 on the second region R2.

The second molding layer 260 may be on and at least partially cover a lateral surface of the second semiconductor chip 250. For example, the second molding layer 260 may be on and at least partially cover a lateral surface of the second body 252 and a lateral surface of the second passivation layer 258. When viewed in plan, the second molding layer 260 may be provided in the third region R3. The second molding layer 260 may expose a top surface 250*a* of the second semiconductor chip 250. The second molding layer 260 may have a top surface 260*a* coplanar with the top surface 250*a* of the second semiconductor chip 250. In other embodiments, the second molding layer 260 may be on and at least partially cover the top surface 250*a* of the second semiconductor chip 250. The second molding layer 260 may expose a bottom surface 250*b* of the second semiconductor chip 250. The second molding layer 260 may have a bottom surface 260*b* coplanar with the bottom surface 250*b* of the second semiconductor chip 250. On the third region R3, the second molding layer 260 may be in contact with the first molding layer 240. The second molding layer 260 may have a lateral surface linearly aligned with that of the first molding layer 240.

The second molding layer 260 may include a dielectric polymer, such as an epoxy-based molding compound and a filler, such as silicon oxide, silicon carbide, or alumina. The second molding layer 260 may include a material the same as or different from that of the first molding layer 240.

Referring to FIGS. 1, 2, and 3B, one or more conductive posts 234 may be provided on the first redistribution substrate 100 and laterally spaced apart from the first semiconductor chip 210. The conductive post 234 may be disposed between the top surface of the first redistribution substrate 100 and the bottom surface 250*b* of the second semiconductor chip 250, and may be electrically connected to the first redistribution substrate 100 and the second semiconductor chip 250. When viewed in plan, the conductive post 234 may be provided on the second region R2 to border or surround the first semiconductor chip 210 in a plan view. The conductive post 234 may extend into or penetrate the first molding layer 240. The conductive posts 234 may be coupled to the bump pads 224. The conductive post 234 may have a fourth width W4. The fourth width W4 may be a width in the first direction D1 or the second direction D2. The fourth width W4 may be greater than the second width W2.

The conductive posts 234 may be provided with fourth bonding pads 232 thereon. The fourth bonding pads 232 may be interposed between the conductive posts 234 and the third bonding pads 256. For example, the conductive post 234 may vertically overlap the third and fourth bonding pads 256 and 232. The fourth bonding pad 232 may be provided in the second region R2. The fourth bonding pads 232 may be electrically connected to the conductive posts 234 and the third bonding pads 256. The first molding layer 240 may expose top surfaces of the fourth bonding pads 232. The top surfaces of the fourth bonding pads 232 may be coplanar with the top surface 210*a* of the first semiconductor chip 210 and the top surface 240*a* of the first molding layer 240.

The fourth bonding pads 232 may include metal, such as copper, tungsten, aluminum, nickel, or tin. For example, the fourth bonding pads 232 may include copper. The third bonding pads 256 may be in contact with the fourth bonding pads 232. The third bonding pad 256 and the fourth bonding pad 232 may constitute a single unitary or monolithic shape with no interface therebetween. Although the third and fourth bonding pads 256 and 232 are illustrated to have their sidewalls linearly aligned with each other, embodiments of the present inventive concepts are not limited thereto, and when viewed in plan, the third and fourth bonding pads 256 and 232 may have their sidewalls spaced apart from each other.

Referring back to FIGS. 1 and 2, the conductive post 234 may vertically overlap the passive element 800. For example, the conductive post 234 may completely or partially overlap the passive element 800. The conductive post 234 may be electrically connected through the first redistribution substrate 100 to the passive element 800. The conductive post 234 may be a voltage supply post and serve as a voltage supply path. The voltage may be a power voltage or a ground voltage. For example, a voltage output from the passive element 800 may be transferred through the conductive post 234 to the semiconductor chip 250. Because the conductive post 234 vertically overlaps the second semiconductor chip 250 and the passive element 800, a voltage supply path between the second semiconductor chip 250 and the passive element 800 may have a reduced length. According to the present inventive concepts, the fourth width W4 of the conductive post 234 may be greater than the second width W2 of the through via 214. The conductive post 234 may directly connect the first redistribution substrate 100 and the second semiconductor chip 250 to each other without passing through the first semiconductor chip 210. Therefore, the conductive post 234 may decrease in resistance, and may satisfactorily provide the second semiconductor chip 250 with a desired voltage. Accordingly, the semiconductor package 10 may increase in electrical properties.

In addition, the first bonding pads 216 may be in direct contact with the second bonding pads 254, and the third bonding pads 256 may be in direct contact with the fourth bonding pads 232. Thus, a voltage supply path between the first semiconductor chip 210, the second semiconductor chip 250, and the first redistribution substrate 100 may have a reduced length, and accordingly the semiconductor package 10 may have improved electrical properties.

A voltage applied to one external connection terminal 500 may be transferred through the passive element 800 to the second semiconductor chip 250. Because the passive element 800 provides the semiconductor chip 250 with voltage, the semiconductor package 10 may exhibit improved power integrity properties.

The connection structure 300 may be disposed on the first redistribution substrate 100. The connection structure 300 may be disposed on the top surface at an edge region of the first redistribution substrate 100. The connection structure 300 may be provided in plural, and the plurality of connection structures 300 may be spaced apart from each other. The connection structures 300 may be laterally spaced apart from the first semiconductor chip 210, the conductive post 234, the second semiconductor chip 250, the first molding layer 240, and the second molding layer 260. When viewed in plan, the connection structures 300 may border or surround the first semiconductor chip 210, the conductive post 234, the second semiconductor chip 250, the first molding layer 240, and the second molding layer 260. The connection structures 300 may have their top surfaces located at a higher level than that of top surfaces of the conductive posts 234. The top surfaces of the connection structures 300 may be located at a level the same as or higher than that of the top surface 250*a* of the second semiconductor chip 250. The connection structures 300 may be correspondingly disposed on and coupled to the first redistribution pads 150. Therefore, the connection structures 300 may be coupled to the first redistribution substrate 100. The connection structures 300 may be electrically connected through the first redistribution substrate 100 to the external connection terminals 500, the first semiconductor chip 210, and/or the second semiconductor chip 250. Each of the connection structures 300 may have a cylindrical shape. However, the shape of the connection structure 300 may be variously changed in different embodiments. The connection structures 300 may be metal posts. For example, the connection structures 300 may include copper or tungsten.

The semiconductor package 10 may further include conductive seed patterns 305. The conductive seed patterns 305 may be correspondingly disposed on bottom surfaces of the connection structures 300. For example, the conductive seed patterns 305 may be disposed between the connection structures 300 and their corresponding first redistribution pads 150. The conductive seed patterns 305 may include a metallic material different from that of the first redistribution pads 150 and that of the connection structures 300. Differently from that shown, the conductive seed patterns 305 may be omitted, and the connection structures 300 may be directly coupled to the first redistribution pads 150.

The third molding layer 400 may be disposed on the first redistribution substrate 100 to be on and at least partially cover sidewalls of the connection structures 300, a sidewall of the first molding layer 240, and a sidewall of the second molding layer 260. The third molding layer 400 may further be on and at least partially cover the top surface 250*a* of the second semiconductor chip 250. The third molding layer 400 may have a top surface coplanar with those of the connection structures 300. Differently from that shown, the third molding layer 400 may further expose the top surface 250*a* of the second semiconductor chip 250. The third molding layer 400 may further be on and at least partially cover the bump structure 220. The third molding layer 400 may encapsulate the bump pads 224, the barrier patterns 225, the bonding patterns 226, and the solder bumps 227. In other embodiments, an underfill pattern (not shown) may be interposed between the first redistribution substrate 100 and the bump structure 220. The third molding layer 400 may have a sidewall aligned with that of the first redistribution substrate 100.

The third molding layer 400 may include a dielectric polymer, such as an epoxy-based molding compound and a filler, such as silicon oxide, silicon carbide, or alumina. The third molding layer 400 may include a material the same as or different from that of the first molding layer 240 and that of the second molding layer 260.

The second redistribution substrate 600 may be disposed on the third molding layer 400 and the connection structures 300. The second redistribution substrate 600 may be disposed on the second semiconductor chip 250 and vertically spaced apart from the top surface 250*a* of the second semiconductor chip 250. The second redistribution substrate 600 may be electrically connected to the connection structures 300.

The second redistribution substrate 600 may include a second dielectric layer 601, the second redistribution patterns 630, second seed patterns 635, and second redistribution pads 650. The second dielectric layer 601 may be provided in plural. The plurality of second dielectric layers 601 may be stacked on the third molding layer 400. The second dielectric layers 601 may include a photo-imageable dielectric (PID) material. The second dielectric layers 601 may include the same material as each other. An indistinct interface may be provided between neighboring second dielectric layers 601. The number of the second dielectric layers 601 may be variously changed in different embodiments.

The second redistribution patterns 630 may be provided on the connection structures 300. Each of the second redistribution patterns 630 may include a second via part and a second wire part. The second via part may be provided in a corresponding second dielectric layer 601. The second wire part may be provided on the second via part, and the second wire part and the second via part may be connected to each other with no interface therebetween. The second wire part of each of the second redistribution patterns 630 may extend onto a top surface of a corresponding second dielectric layer 601. The second redistribution patterns 630 may include metal, such as copper.

The second redistribution patterns 630 may include second lower redistribution patterns and second upper redistribution patterns that are stacked on each other. For example, the second lower redistribution patterns may be provided on the top surfaces of the connection structures 300 to be coupled to the connection structures 300. The second upper redistribution patterns may be disposed on and coupled to the second lower redistribution patterns.

The second seed patterns 635 may be correspondingly disposed on bottom surfaces of the second redistribution patterns 630. For example, each of the second seed patterns 635 may be provided on a bottom surface and a sidewall of the second via part of a corresponding second redistribution pattern 630 and may extend onto a bottom surface of the second wire part of the corresponding second redistribution pattern 630. The second seed patterns 635 may include a metallic material different from that of the connection structures 300 and that of the second redistribution patterns 630. The second seed patterns 635 may serve as barrier layers to reduce or prevent diffusion of materials included in the second redistribution patterns 630.

The second redistribution pads 650 may be disposed on the second upper redistribution patterns of the second redistribution patterns 630 to be coupled to the second redistribution patterns 630. The second redistribution pads 650 may be laterally spaced apart from each other. The second redistribution pads 650 may have their lower portions that are provided in an uppermost second dielectric layer 601. The second redistribution pads 650 may have their upper portions that extend onto a top surface of the uppermost second dielectric layer 601. The second redistribution pads 650 may include metal, such as copper.

The second redistribution pads 650 may be coupled through the redistribution patterns 630 to the connection structures 300. As the second redistribution patterns 630 are provided, at least one second redistribution pad 650 may not be vertically aligned with the connection structure 300 electrically connected to the at least one second redistribution pad 650. Accordingly, it may be possible to freely design an arrangement of the second redistribution pads 650. The number of the second redistribution patterns 630 stacked between one connection structure 300 and its corresponding second redistribution pad 650 may be variously changed without being limited to that shown. For example, one or three or more second redistribution patterns 630 may be provided between one connection structure 300 and its corresponding second redistribution pad 650.

The second redistribution substrate 600 may further include second seed pads 655. The second seed pads 655 may be interposed between an uppermost second redistribution patterns 630 and the second redistribution pads 650. The second seed pads 655 may include a metallic material.

Figure 4:
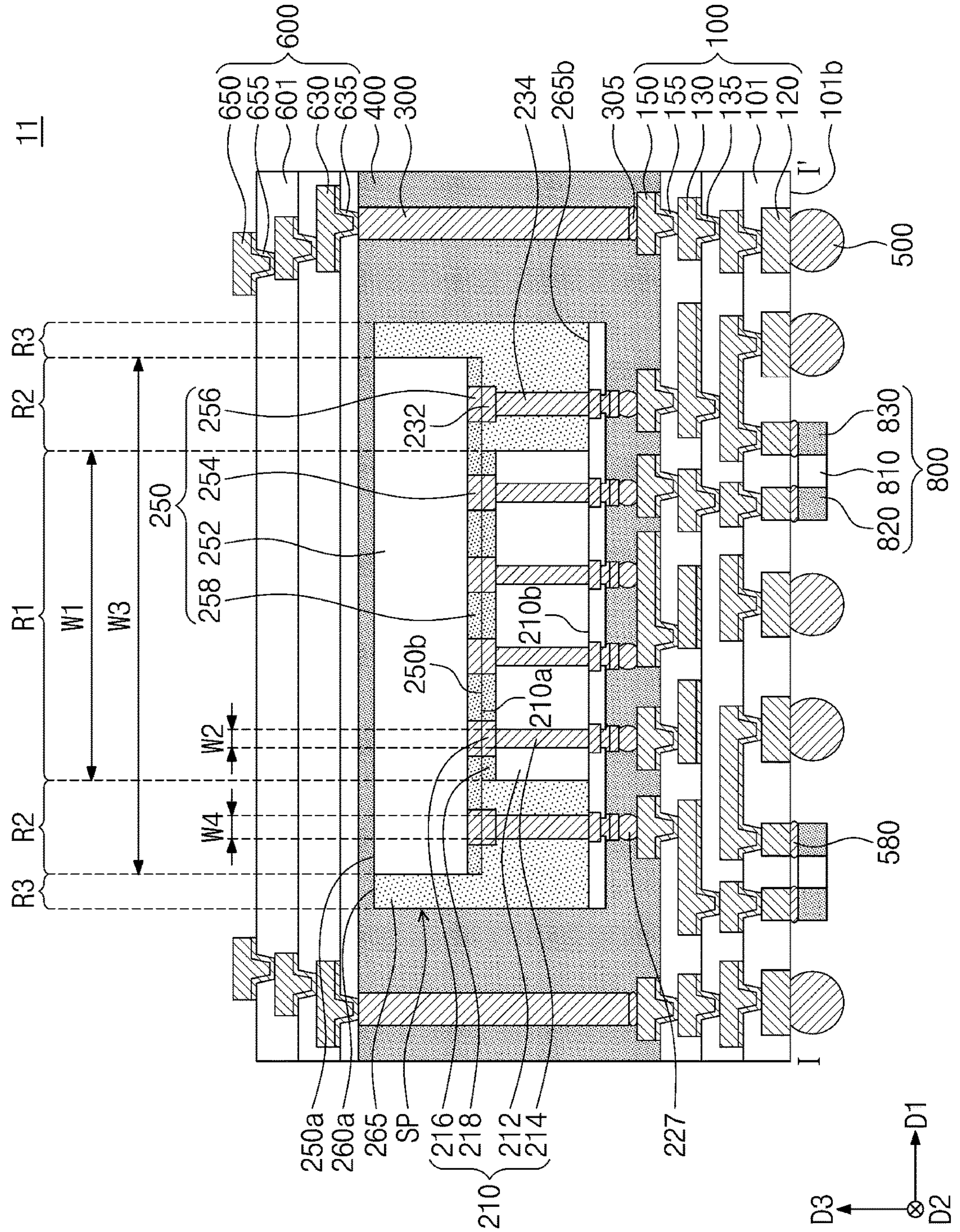
FIG. 4 is a cross-sectional view illustrating a semiconductor package according to some embodiments of the present inventive concepts.

FIG. 4 is a cross-sectional view illustrating a semiconductor package according to some embodiments of the present inventive concepts. Except the following description, omission will be made to avoid descriptions of those features described with reference to FIGS. 1 to 3B.

Referring to FIG. 4, a semiconductor package 11 may include a fourth molding layer 265 instead of the first and second molding layers 240 and 260 depicted in FIGS. 1 and 2. The fourth molding layer 265 may be obtained by merging the first and second molding layers 240 and 260 of FIG. 2. The fourth molding layer 265 may be on and at least partially cover the lateral surface of the first semiconductor chip 210, the lateral surface of the second semiconductor chip 250, and a portion of the bottom surface 250*b* of the second semiconductor chip 250. The fourth molding layer 265 may be on and at least partially cover a lateral surface of the conductive post 234 and lateral surfaces of the fourth bonding pads 232. The fourth molding layer 265 may be on and at least partially cover a top surface of the passivation pattern 223. The fourth molding layer 265 may have a top surface 265*a* coplanar with the top surface 250*a* of the second semiconductor chip 250. The fourth molding layer 265 may have a bottom surface 265*b* coplanar with the bottom surface 210*b* of the first semiconductor chip 210.

The sub-semiconductor package SP may have a first region R1, a second region R2, and a third region R3. The first region R1 may be constituted by an area that the first semiconductor chip 210 occupies and an area that vertically overlaps the first semiconductor chip 210. The second region R2 may be constituted by an edge region of the second semiconductor chip 250 and an area that vertically overlaps the edge region. The third region R3 may be constituted by an area of the fourth molding layer 265 that borders or surrounds the lateral surface of the second semiconductor chip 250 in a plan view and an area that overlaps the surrounding area of the fourth molding layer 265. The third region R3 may border or surround the second region R2 in a plan view. When viewed in plan, neither the second region R2 nor the third region R3 may overlap the first semiconductor chip 200. When viewed in plan, the third region R3 may not overlap the second region R2. When viewed in plan, the third region R3 may not overlap any of the first semiconductor chip 210 and the second semiconductor chip 250.

On the second region R2, the conductive post 234 may extend into or penetrate the fourth molding layer 265 to be coupled to the fourth bonding pad 232 and the bump pad 224. The fourth molding layer 265 may be provided only on the second region R2 and the third region R3.

The fourth molding layer 265 may include a dielectric polymer, such as an epoxy-based molding compound and a filler, such as silicon oxide, silicon carbide, and/or alumina.

Figure 5:
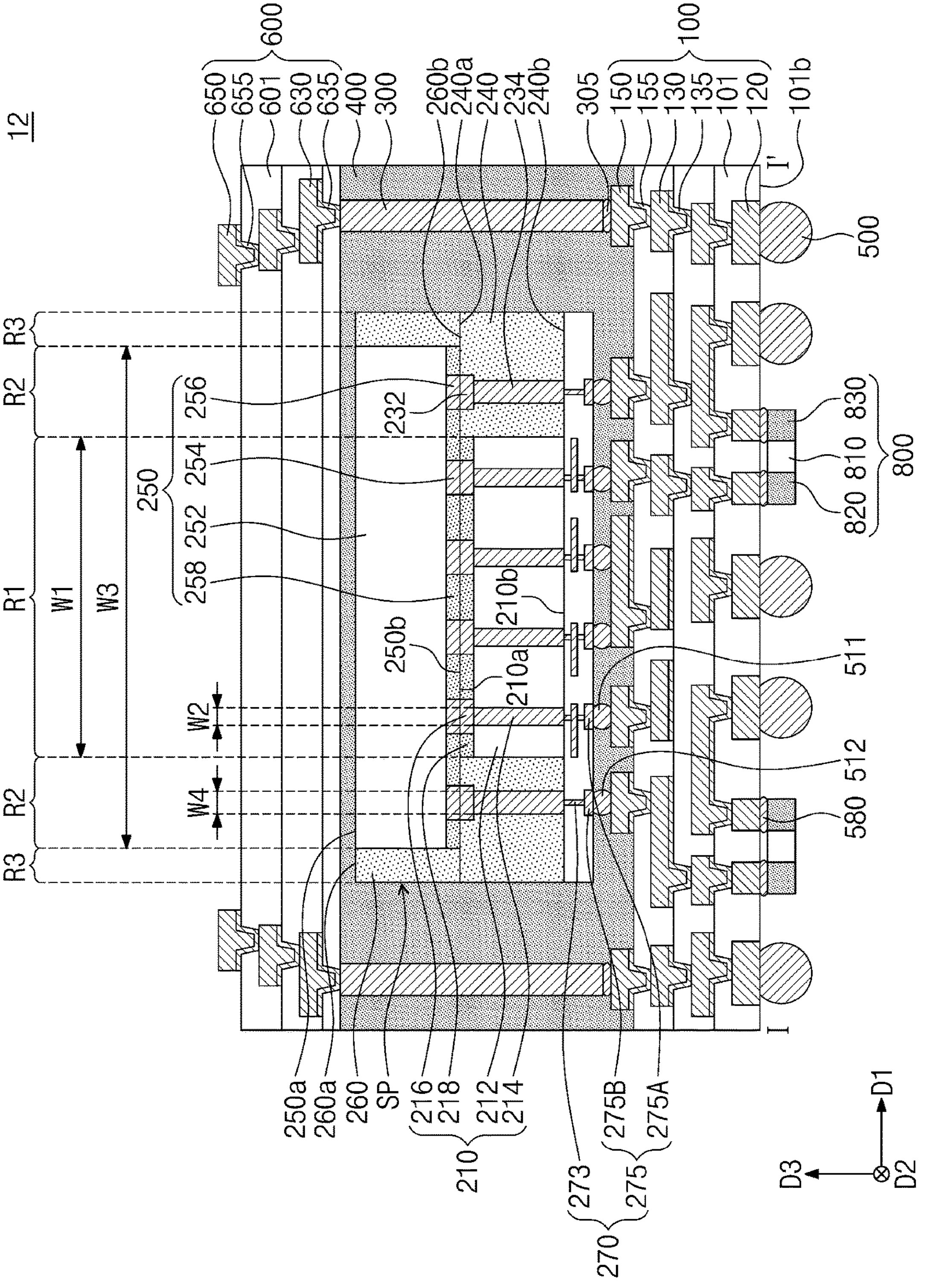
FIG. 5 illustrates a cross-sectional view illustrating a semiconductor package according to some embodiments of the present inventive concepts.

FIG. 5 is a cross-sectional view illustrating a semiconductor package according to some embodiments of the present inventive concepts. Except the following description, omission will be made to avoid description of those features described with reference to FIGS. 1 to 3B.

Referring to FIG. 5, a semiconductor package 12 may include a lower redistribution layer 270 instead of the bump structure 220 depicted in FIGS. 1 and 2. For example, the bump structure 220 may be omitted in some embodiments. The lower redistribution layer 270 may be disposed on the bottom surface 210*b* of the first semiconductor chip 210, the bottom surface 240*b* of the first molding layer 240, and a bottom surface of the conductive post 234. The lower redistribution layer 270 may include a lower dielectric layer, lower redistribution patterns 273, and lower redistribution pads 275. The lower dielectric layer may include an organic material, such as a photo-imageable dielectric (PID) material. The lower dielectric layer may be a multiple layer, but embodiments of the present inventive concepts are not limited thereto. The lower redistribution patterns 273 may be provided in the lower dielectric layer. At least one of the lower redistribution patterns 273 may be coupled to the conductive post 234. Others of the lower redistribution patterns 273 may be coupled to the through vias 214. The phrase "electrically connected to the lower redistribution layer 270" may include the meaning "electrically connected to the lower redistribution patterns 273."

The lower redistribution pads 275 may be provided on a bottom surface of the lower redistribution layer 270 to come into electrical connection with the lower redistribution patterns 273. The lower redistribution pads 275 may include first lower redistribution pads 275A and second lower redistribution pads 275B. On the first region R1, the first lower redistribution pads 275A may be coupled through the lower redistribution patterns 273 to the through vias 214. Differently from that shown, at least one of the first lower redistribution pads 275A may not be vertically connected to the through vias 214 electrically connected thereto. Therefore, an arrangement of the first lower redistribution pads 275A may be more freely designed without being limited to an arrangement of through vias 214.

The second lower redistribution pad 275B may be coupled to the conductive post 234 through a corresponding lower redistribution pattern 273 on the second region R2. The second lower redistribution pads 275B may be laterally spaced apart and electrically insulated from the first lower redistribution pads 275A. The second lower redistribution pad 275B may be a voltage supply pad. At least one of the second lower redistribution pads 275B may vertically overlap the conductive post 234. Therefore, an electrical path between the passive element 800 and the conductive post 234 may have a reduced length. The lower redistribution patterns 273 and the lower redistribution pads 275 may include metal.

The semiconductor package 12 may further include first bumps 511 and second bumps 512. On the first region R1, the first bumps 511 may be interposed between the first redistribution substrate 100 and the first semiconductor chip 210. For example, each of the first bumps 511 may be provided between the first redistribution substrate 100 and the lower redistribution layer 270 to be coupled to a corresponding first redistribution pad 150 and a corresponding lower redistribution pad 275. Therefore, the first bumps 511 may be electrically connected to the through vias 214. The first bumps 511 may include a solder material. The first bumps 511 may further include pillar patterns (not shown).

On the second region R2, the second bump 512 may be interposed between the first redistribution substrate 100 and the conductive post 234. For example, the second bump 512 may be provided between the first redistribution substrate 100 and the lower redistribution layer 270 to be coupled to a corresponding first redistribution pad 150 and a corresponding second lower redistribution pad 275B. Therefore, the second bump 512 may be electrically connected to the conductive post 234. The second bump 512 may be a power bump or a ground bump, and may serve as a path through which a voltage is supplied to the second semiconductor chip 250. The second bump 512 may have a height substantially the same as those of the first bumps 511. The second bump 512 may have a width substantially the same as those of the first bumps 511. The phrase "certain components are the same in terms of width, height, and level" may include an allowable tolerance possibly occurring during fabrication process. The second bump 512 may include a solder material. The second bump 512 may further include a pillar pattern (not shown).

Figure 6:
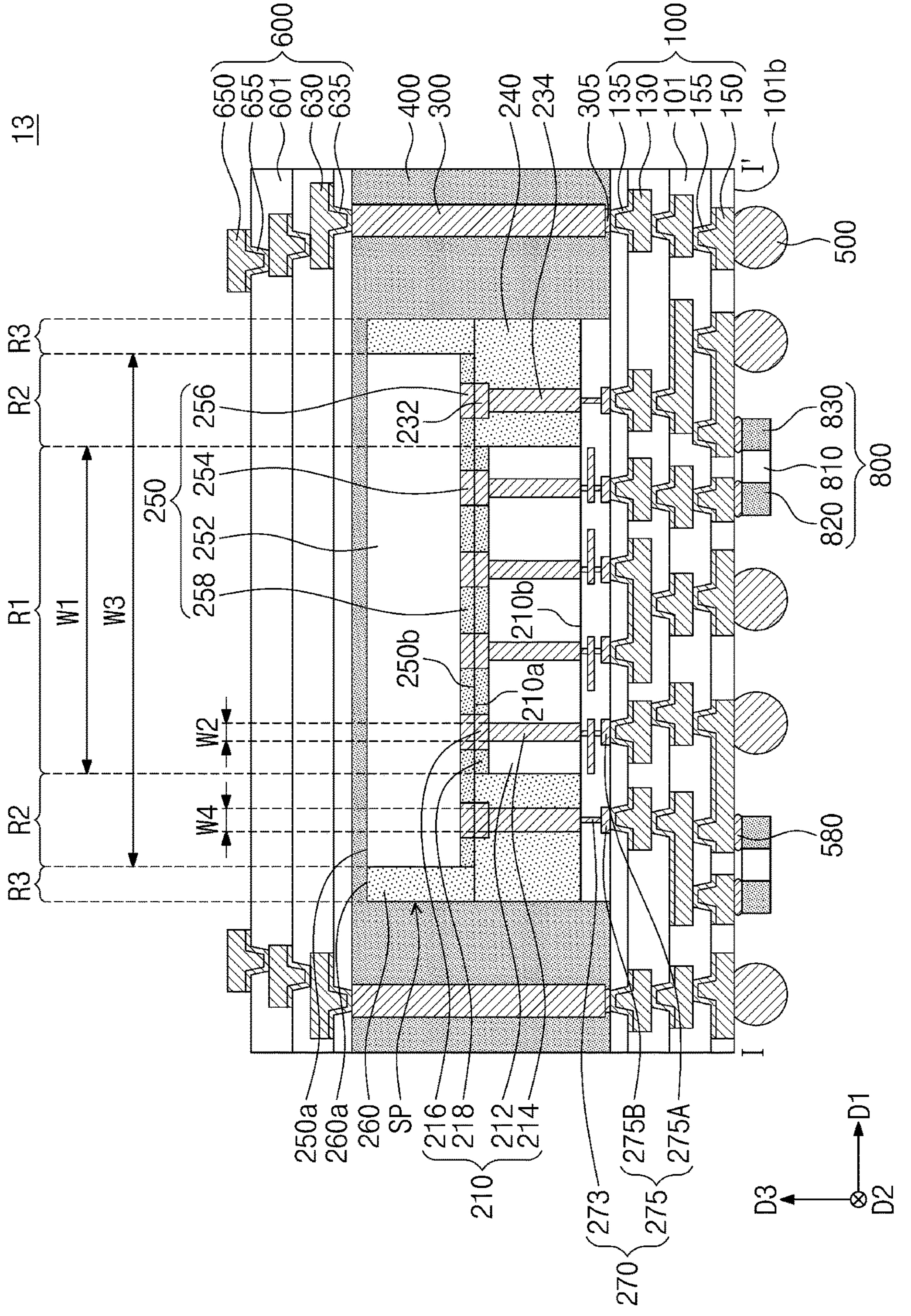
FIG. 6 is a cross-sectional view illustrating a semiconductor package according to some embodiments of the present inventive concepts.

FIG. 6 is a cross-sectional view illustrating a semiconductor package according to some embodiments of the present inventive concepts. Except the following description, omission will be made to avoid description of those features described with reference to FIGS. 1 to 3B and 5.

Referring to FIG. 6, a semiconductor package 13 may include a first redistribution substrate 100, external connection terminals 500, a passive element 800, first and second semiconductor chips 210 and 250, first, second, and third molding layers 240, 260, and 400, conductive posts 234, connection structures 300, and a second redistribution substrate 600. The semiconductor package 13 may include none of the first bumps 511 and the second bumps 512 described with reference to FIG. 5.

The first redistribution substrate 100 may include first dielectric layers 101, first redistribution patterns 130, first seed patterns 135, first seed pads 155, and first redistribution pads 150. The first redistribution substrate 100 may not include the under-bump patterns 120 discussed in FIGS. 1 and 2. The first redistribution substrate 100 may be in direct contact with the lower redistribution layer 270 and the third molding layer 400. For example, the uppermost first dielectric layer 101 may be in direct contact with a bottom surface of the lower redistribution layer 270 and a bottom surface of the third molding layer 400.

The first seed patterns 135 may be correspondingly provided on top surfaces of the first redistribution patterns 130. The first seed patterns 135 in the uppermost first dielectric layer 101 may be coupled to the lower redistribution pads 275 or the conductive seed patterns 305. For example, each of uppermost first redistribution patterns 130 may include a first via part that vertically overlaps one of the redistribution pads 275 and the conductive seed patterns 305.

Differently from that shown, the lower redistribution layer 270 may be omitted, and the first redistribution substrate 100 may be in direct contact with the first molding layer 240, the conductive post 234, and the first semiconductor chip 210 in other embodiments.

The external connection terminals 500 may be disposed on bottom surfaces of lowermost first redistribution patterns 130. The lowermost first redistribution patterns 130 may serve as pads for the external connection terminals 500.

The semiconductor package 13 may be fabricated by a chip-first process, but embodiments of the present inventive concepts are not limited thereto.

Figure 7:
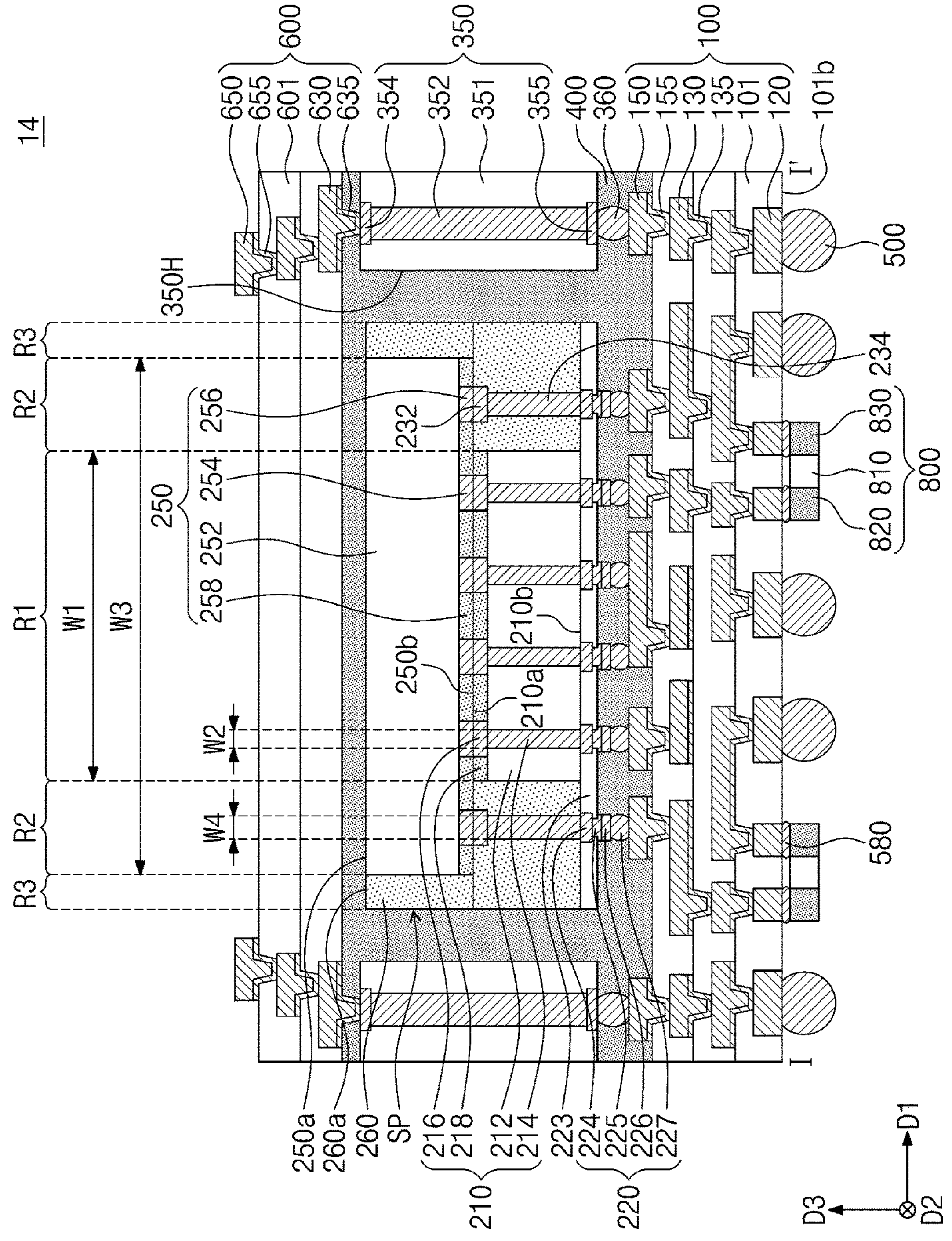
FIG. 7 is a cross-sectional view illustrating a semiconductor package according to some embodiments of the present inventive concepts.

FIG. 7 is a cross-sectional view illustrating a semiconductor package according to some embodiments of the present inventive concepts. Except the following description, omission will be made to avoid description of those features described with reference to FIGS. 1 to 3B.

Referring to FIG. 7, a semiconductor package 14 may include a connection substrate 350 instead of the connection structure 300 depicted in FIGS. 1 and 2. The connection substrate 350 may include a base layer 351, a vertical structure 352, an upper connection pad 354, and a lower connection pad 355. The connection substrate 350 may include a through hole 350H.

The base layer 351 may be provided on the first redistribution substrate 100. The base layer 351 may be disposed spaced apart from the first semiconductor chip 210, the second semiconductor chip 250, the first molding layer 240, and the second molding layer 260. For example, the base layer 351 may include a dielectric resin. According to some embodiments, the base layer 351 may include polyhydroxystyrene (PHS), polybenzoxazole (PBO), and/or polypropylene glycol (PPG).

The vertical structure 352 may be provided to extend into or penetrate the base layer 351. The upper connection pad 354 may be provided on a top surface of the base layer 351. The upper connection pad 354 may be electrically connected to a corresponding one of the second redistribution patterns 630. The lower connection pad 355 may be provided on a bottom surface of the base layer 351. The lower connection pad 355 may be connected to a corresponding one of the first redistribution pads 150. The vertical structure 352 may connect the upper connection pad 354 to the lower connection pad 355. The vertical structure 352 may include a metallic material, such as copper. The upper connection pad 354 and the lower connection pad 355 may include a metallic material, such as aluminum.

The semiconductor package 14 may further include a connection terminal 360. The connection terminal 360 may be interposed between and electrically connected to the connection substrate 350 and the first redistribution substrate 100. The connection terminal 360 may be in contact with the lower connection pad 355 of the connection substrate 350 and with a corresponding one of the first redistribution pads 150 included in the first redistribution substrate 100. The connection terminal 360 may include a solder material. The solder material may include, for example, tin, bismuth, lead, silver, and/or any alloy thereof.

When viewed in plan, the through hole 350H may be provided therein with the first semiconductor chip 210, the bump structure 220, the second semiconductor chip 250, the first molding layer 240, and the second molding layer 260. For example, when viewed in plan, the connection substrate 350 may border or surround the first semiconductor chip 210, the bump structure 220, the second semiconductor chip 250, the first molding layer 240, and the second molding layer 260.

The third molding layer 400 may be interposed between the first molding layer 240 and the second molding layer 260. The third molding layer 400 may extend onto a bottom surface of the connection substrate 350 to border or surround a lateral surface of the connection terminal 360. The third molding layer 400 may encapsulate the connection terminal 360. In other embodiments, an underfill pattern (not shown) may be interposed between the connection substrate 350 and the first redistribution substrate 100.

The semiconductor package 14 may be a fan-out panel level package (FOPLP), but embodiments of the present inventive concepts are not limited thereto.

Figure 8:
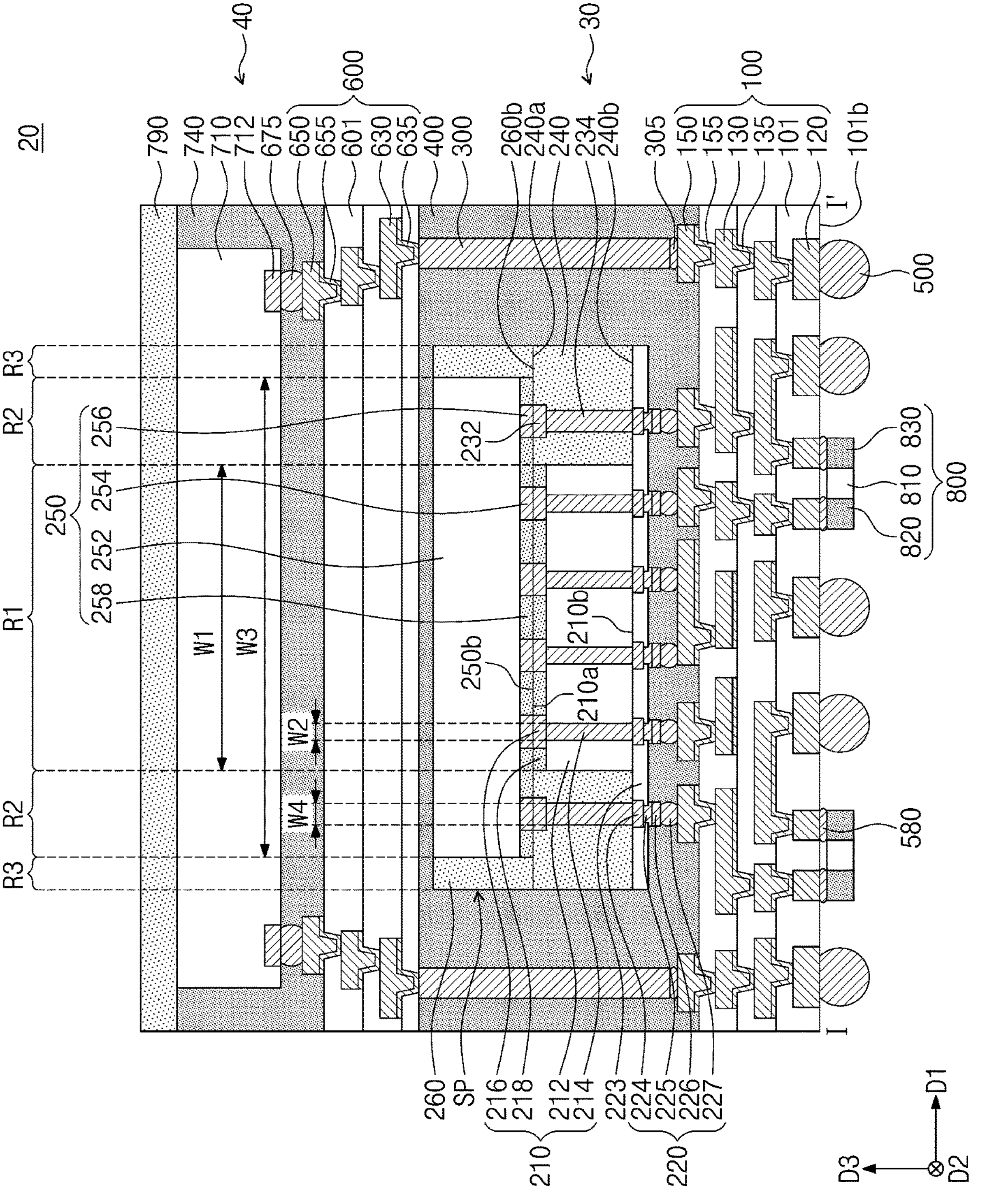
FIG. 8 is a cross-sectional view illustrating a semiconductor package according to some embodiments of the present inventive concepts.

FIG. 8 is a cross-sectional view illustrating a semiconductor package according to some embodiments of the present inventive concepts.

Referring to FIG. 8, a semiconductor package 20 may include a lower package 30 and an upper package 40. The lower package 30 may be substantially the same as the semiconductor package 10 described in the example of FIGS. 1 and 2. For example, the lower package 30 may include a first redistribution substrate 100, external connection terminals 500, a passive element 800, a sub-semiconductor package SP, connection structures 300, a third molding layer 400, and a second redistribution substrate 600. For another example, the lower package 30 may be substantially the same as the semiconductor package 12 of FIG. 4, the semiconductor package 13 of FIG. 6, or the semiconductor package 14 of FIG. 7.

The upper package 40 may include an upper semiconductor chip 710 and an upper molding layer 740. The upper package 40 may further include a thermal radiation structure 790. The upper semiconductor chip 710 may be disposed on a top surface of the second redistribution substrate 600. Connection bumps 675 may be disposed between the second redistribution substrate 600 and the upper semiconductor chip 710 to be coupled to the second redistribution pads 650 and upper chip pads 712. The upper chip pads 712 may be provided on a bottom surface of the upper semiconductor chip 710. The upper molding layer 740 may be directly disposed on the second redistribution substrate 600. The upper molding layer 740 may further extend onto the bottom surface of the upper semiconductor chip 710 to encapsulate the connection bumps 675. In other embodiments, an underfill pattern (not shown) may be interposed between the second redistribution substrate 600 and the upper semiconductor chip 710.

The thermal radiation structure 790 may be disposed on a top surface of the upper semiconductor chip 710 and a top surface of the upper molding layer 740. The thermal radiation structure 790 may further extend onto a lateral surface of the upper molding layer 740. The thermal radiation structure 790 may include a heat sink, a heat slug, or a thermal interface material (TIM) layer. The thermal radiation structure 790 may include, for example, metal.

Figure 9:
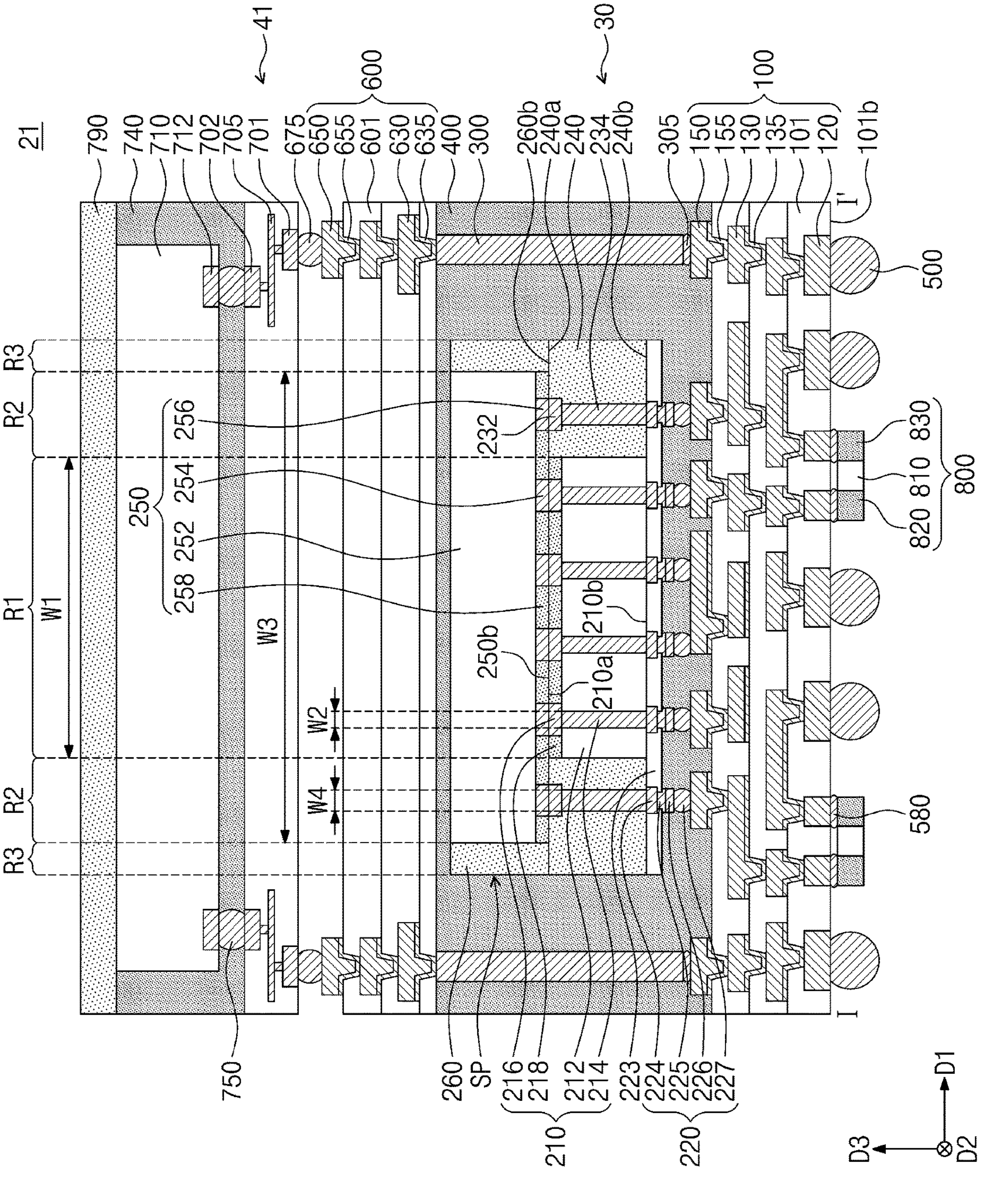
FIG. 9 is a cross-sectional view illustrating a semiconductor package according to some embodiments of the present inventive concepts.

FIG. 9 is a cross-sectional view illustrating a semiconductor package according to some embodiments of the present inventive concepts.

Referring to FIG. 9, a semiconductor package 21 may include a lower package 30 and an upper package 41. The lower package 30 may be substantially the same as that discussed in the example of FIG. 8.

The upper package 41 may include an upper substrate 700, an upper semiconductor chip 710, an upper molding layer 740, and a thermal radiation structure 790. The upper substrate 700 may be disposed on and spaced apart from a top surface of the second redistribution substrate 600. The upper substrate 700 may be a printed circuit board (PCB) or a redistribution layer. The upper substrate 700 may be provided with first substrate pads 701 and second substrate pads 702 respectively on a bottom surface and a top surface of the upper substrate 700. The upper substrate 700 may be provided therein with metal lines 701 coupled to the first substrate pads 701 and the second substrate pads 702.

The upper semiconductor chip 710 may be mounted on a top surface of the upper substrate 700. The upper semiconductor chip 710 may include upper chip pads 712 on a bottom surface thereof. Differently from that shown, the upper semiconductor chip 710 may be provided in plural. The plurality of upper semiconductor chips 710 may be vertically stacked on each other. In other embodiments, the plurality of upper semiconductor chips 710 may be disposed laterally spaced apart from each other. A single upper semiconductor chip 710 will be described in the interest of brevity.

The upper package 41 may further include upper bumps 750. The upper bumps 750 may be provided between the upper substrate 700 and the upper semiconductor chip 710 to be coupled to the second substrate pads 702 and the upper chip pads 712. The upper bumps 750 may include a solder material. The upper bumps 750 may further include pillar patterns.

The second redistribution substrate 600 and the upper substrate 700 may be provided with connection bumps 675 therebetween. For example, the connection bumps 675 may be provided between and coupled to the second redistribution pads 650 and the first substrate pads 701. Therefore, the upper semiconductor chip 710 may be electrically connected through the connection bumps 675 to the second semiconductor chip 250, the first semiconductor chip 210, and/or the external connection terminals 500.

The upper substrate 700 may be provided thereon with the upper molding layer 740 that is on and at least partially covers the upper semiconductor chip 710. The upper molding layer 740 may include a dielectric polymer, such as an epoxy-based molding compound.

The thermal radiation structure 790 may be disposed on a top surface of the upper semiconductor chip 710 and a top surface of the upper molding layer 740. The thermal radiation structure 790 may have the same configuration as that of the thermal radiation structure 790 depicted in FIG. 8.

FIGS. 10 to 13 are cross-sectional views illustrating a method of fabricating a semiconductor package according to some embodiments of the present inventive concepts.

Figure 10:
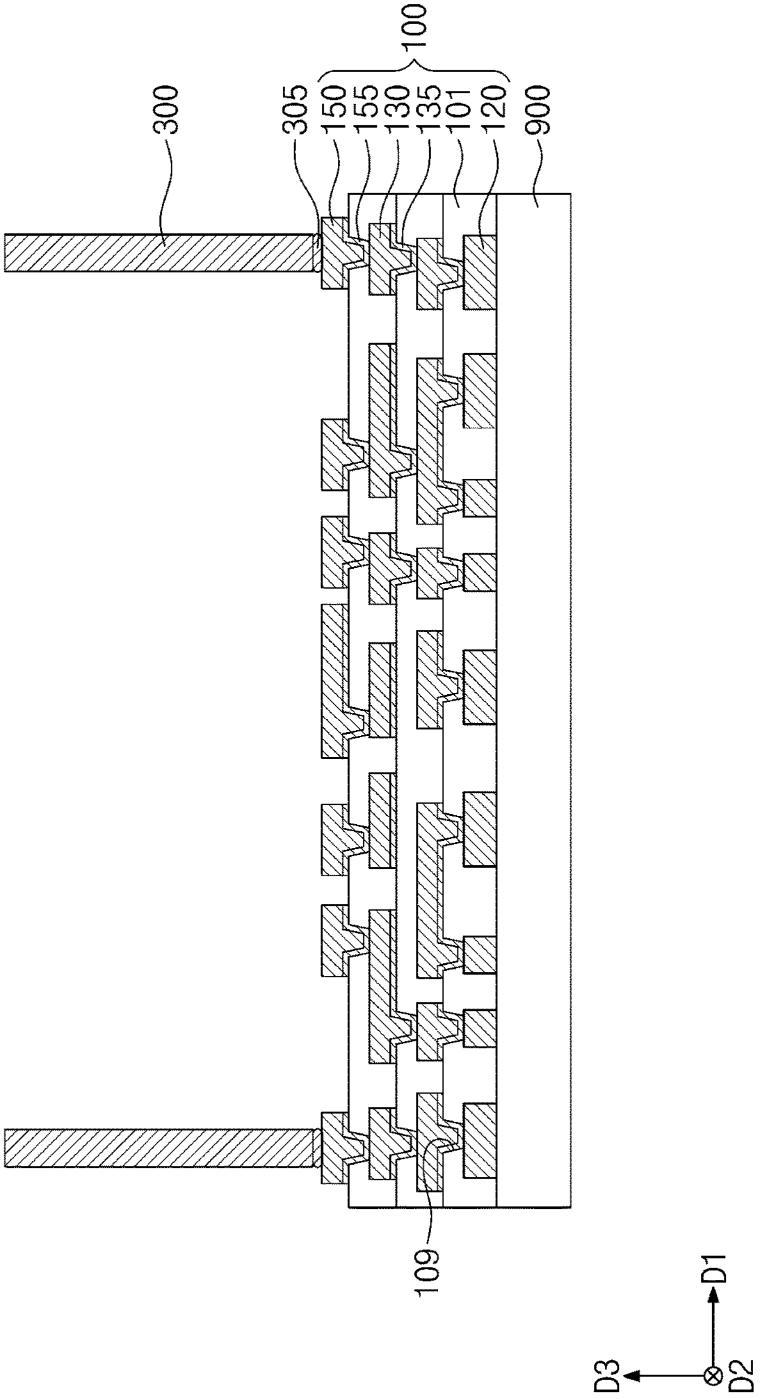
FIGS. 10 to 13 are cross-sectional views illustrating a method of fabricating a semiconductor package according to some embodiments of the present inventive concepts.

Referring to FIG. 10, under-bump patterns 120, a first dielectric layer 101, first seed patterns 135, and first redistribution patterns 130 may be formed on a first carrier substrate 900.

According to some embodiments, an electroplating process may be performed to form the under-bump patterns 120 on the first carrier substrate 900. The first dielectric layer 101 may be formed on the first carrier substrate 900 to be on and at least partially cover sidewalls and top surfaces of the under-bump patterns 120. First openings 109 may be formed in the first dielectric layer 101 to expose the under-bump patterns 120.

A seed conductive layer (not shown) may be conformally formed in the first openings 109 and on a top surface of the first dielectric layer 101. The first redistribution patterns 130 may be formed by performing an electroplating process in which the seed conductive layer is used as an electrode. The first redistribution patterns 130 may be formed in the first openings 109 and on the top surface of the first dielectric layer 101, forming a portion of the seed conductive layer. Each of the first redistribution patterns 130 may include a first via part and a first wire part. The first via part may be formed in a corresponding first opening 109. The first wire part may be formed on the first via part, and may extend onto the top surface of the first dielectric layer 101. The seed conductive layer may undergo an etching process in which the first redistribution patterns 130 are used as an etching mask to form the first seed patterns 135.

The formation of the first dielectric layer 101, the formation of the first seed patterns 135, and the formation of the first redistribution patterns 130 may be repeatedly performed. Therefore, stacked first dielectric layers 101 may be formed, and stacked first redistribution patterns 130 may be formed.

First redistribution pads 150 may be formed in corresponding first openings 109 of an uppermost first dielectric layer 101, thereby being coupled to the first redistribution patterns 130. Before the first redistribution pads 150 are formed, first seed pads 155 may be formed. An electroplating process may be performed in which the first seed pads 155 are used as electrodes to form the first redistribution pads 150. Therefore, a first redistribution substrate 100 may be manufactured. The first redistribution substrate 100 may include the first dielectric layers 101, the under-bump patterns 120, the first seed patterns 135, the first redistribution patterns 130, the first seed pads 155, and the first redistribution pads 150.

Conductive seed patterns 305 may be formed on the first redistribution pads 150 on an edge region of the first redistribution substrate 100. An electroplating process may be performed in which the conductive seed patterns 305 are used as electrodes to form connection structures 300. The connection structures 300 may be formed on the conductive seed patterns 305. However, neither the conductive seed patterns 305 nor the connection structures 300 may be formed on the first redistribution pads 150 on a central region of the first redistribution substrate 100.

Figure 11:
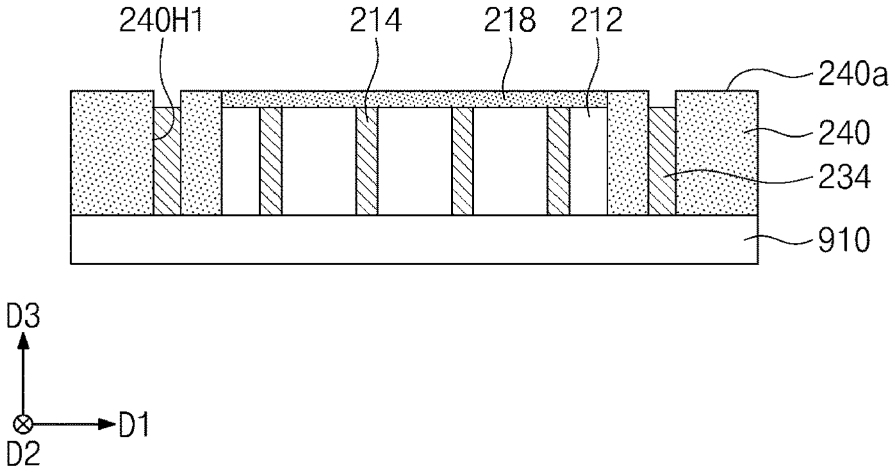

Referring to FIG. 11, one or more conductive post 234 may be formed. A second carrier substrate 910 may be provided thereon with a first body 212 on which through vias 214 and a first passivation layer 218 are formed. A molding layer (not shown) may be formed on top and lateral surfaces of the first body 212. The molding layer may include an epoxy-based molding compound. The molding layer may undergo a planarization process to expose the first passivation layer 218 and to form a first molding layer 240.

The first molding layer 240 may undergo photolithography and etching processes to form second openings 240H1 and the conductive posts 234 in the second openings 240H1. The conductive post 234 may have a top surface at a lower level than that of a top surface 240*a* of the first molding layer 240.

Figure 12:
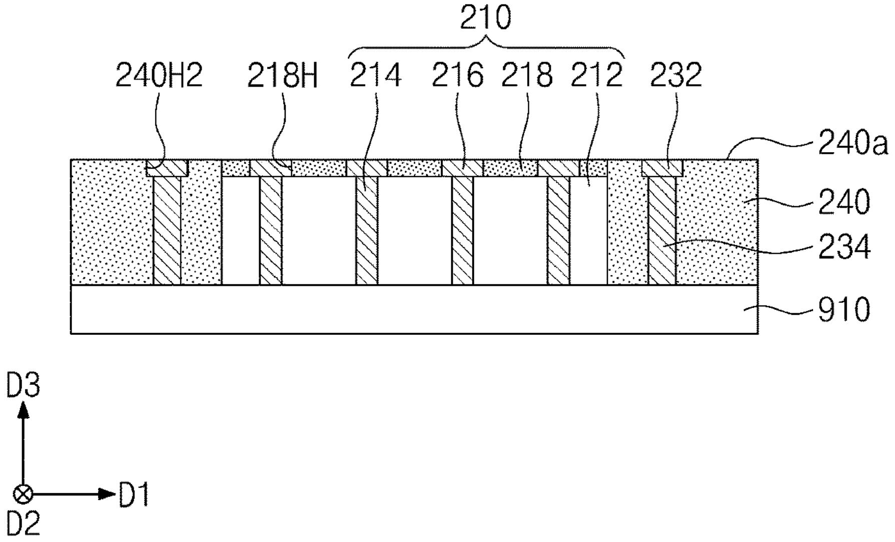

Referring to FIG. 12, first bonding pads 216 and fourth bonding pads 232 may be formed. The formation of the first bonding pads 216 and the fourth bonding pads 232 may include allowing the first molding layer 240 and the first passivation layer 218 to undergo photolithography and etching processes to form third openings 218H and fourth openings 240H2, and forming first and fourth bonding pads 216 and 232 in the third and fourth openings 218H and 240H2. The third openings 218H may be spaces that vertically overlap the through vias 214. The fourth openings 240H2 may be spaces that vertically overlap the conductive posts 234. As the first bonding pads 216 are formed, a first semiconductor chip 210 may be formed.

Figure 13:
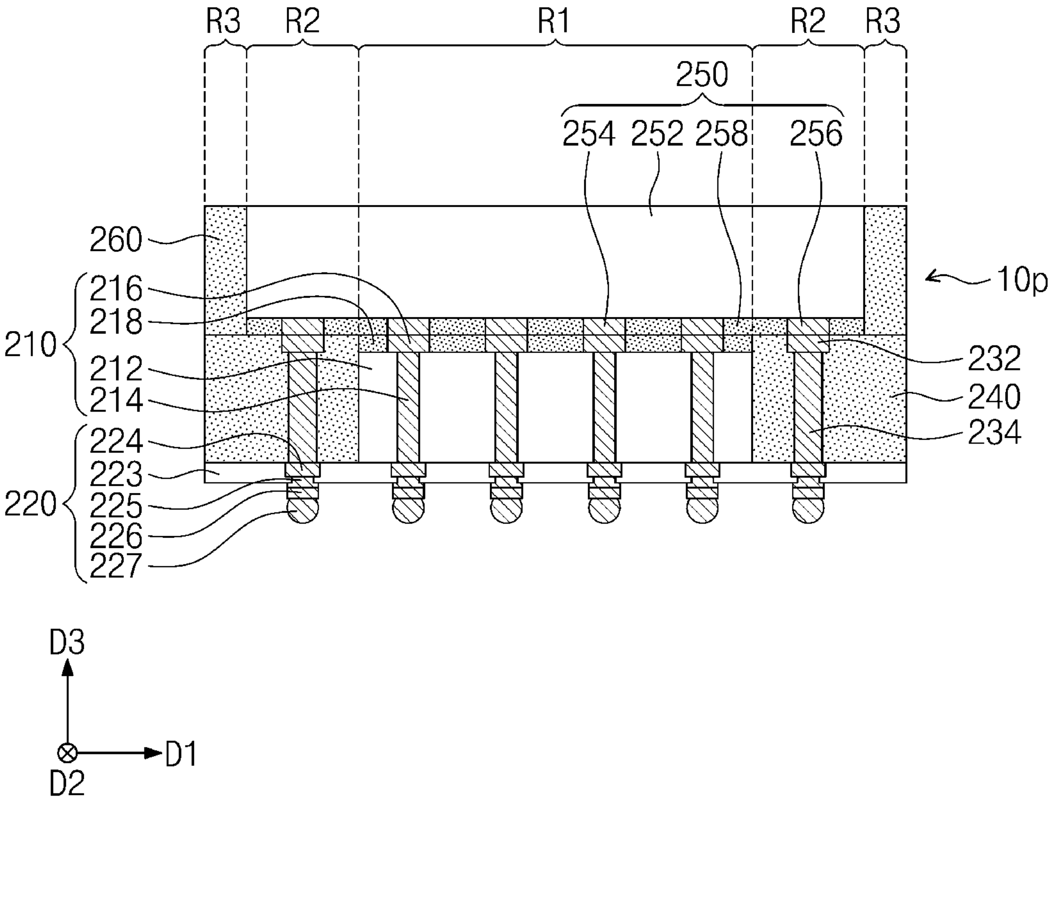

Referring to FIG. 13, a preliminary package 10*p* may be manufactured. For example, a second semiconductor chip 250 and a second molding layer 260 may be formed on the first semiconductor chip 210 and the first molding layer 240. The second semiconductor chip 250 may include a second body 252, second bonding pads 254, third bonding pads 256, and a second passivation layer 258. The second bonding pads 254 may be in contact with the first bonding pads 216. The third bonding pads 256 may be in contact with the fourth bonding pads 232. On a third region R3, the second molding layer 260 may be in contact with the first molding layer 240. The third region R3 may indicate an area the same as that of the third region R3 described with reference to FIGS. 1 and 2.

The second carrier substrate 910 may be removed, and a bump structure 220 may be formed below the first semiconductor chip 210 and the first molding layer 240. The formation of the bump structure 220 may include forming bump pads 224 below the through vias 214 and the conductive posts 234, forming a passivation layer that is on and at least partially covers lateral and top surfaces of the bump pads 224, allowing the passivation layer to undergo photolithography and etching processes to expose at least portions of bottom surfaces of the bump pads 224, and forming barrier patterns 225, bonding patterns 226, and solder bumps 227 that are disposed in a downward direction (D3 direction) below the bump pads 224. Accordingly, the preliminary package 10*p* may be manufactured.

Referring back to FIG. 2, the preliminary package 10*p* manufactured in FIG. 13 may be mounted on a top surface of the first redistribution substrate 100. Therefore, the first semiconductor chip 210, the second semiconductor chip 250, and the conductive posts 234 may be electrically connected to the first redistribution substrate 100.

A third molding layer 400 may be formed on the top surface of the first redistribution substrate 100 to be on and at least partially cover the first redistribution substrate 100, the first molding layer 240, the second molding layer 260, the second semiconductor chip 250, the bump structure 220, and the connection structures 300. The third molding layer 400 may be on and at least partially cover a top surface 250*a* of the second semiconductor chip 250 and top surfaces of the connection structures 300. A top surface of the third molding layer 400 may be located at a higher level than that of the top surface 250*a* of the second semiconductor chip 250 and that of the top surfaces of the connection structures 300. The third molding layer 400 may further extend onto a bottom surface of the bump structure 220 to be on and at least partially cover lateral surfaces of the barrier patterns 225, lateral surfaces of the bonding patterns 226, and lateral surfaces of the solder bumps 227.

A grinding process may be performed on the third molding layer 400 to expose the top surfaces of the connection structures 300. For example, the grinding process may be executed by performing a chemical mechanical polishing process. After the grinding process is terminated, the exposed top surfaces of the connection structures 300 may be located at substantially the same level as that of the top surface of the third molding layer 400. The top surface 250*a* of the second semiconductor chip 250 may be on and at least partially covered with the third molding layer 400. In other embodiments, the top surface 250*a* of the second semiconductor chip 250 may be exposed without being covered with the third molding layer 400.

A second dielectric layer 601, second seed patterns 635, second redistribution patterns 630, second seed pads 655, and second redistribution pads 650 may be formed on the third molding layer 400 and the connection structures 300, with the result that a second redistribution substrate 600 may be manufactured.

According to some embodiments, the second dielectric layer 601 may be formed on the top surface of the third molding layer 400. Openings may be formed in the second dielectric layer 601 to correspondingly expose the top surfaces of the connection structures 300. The second seed patterns 635 may be conformally formed in the openings and on a top surface of the second dielectric layer 601. The second redistribution patterns 630 may be formed in the openings and on the top surface of the second dielectric layer 601, thereby being on and at least partially covering the second seed patterns 635. Each of the second redistribution patterns 630 may include a second via part and a second wire part. The second via part may be formed in a corresponding opening. The second wire part may be formed on the second via part, and may extend onto the top surface of the second dielectric layer 601. The formation of the second seed patterns 635 and the second redistribution patterns 630 may be the same as or similar to the formation of the first seed patterns 135 and the first redistribution patterns 130 described in the example of FIG. 10. The formation of the second dielectric layer 601, the formation of the second seed patterns 635, and the formation of the second redistribution patterns 630 may be performed repeatedly. Accordingly, a plurality of stacked second dielectric layers 601 may be formed, and a plurality of stacked second redistribution patterns 630 may be formed.

Second redistribution pads 650 may be formed in an uppermost second dielectric layer 601 and on the top surface of the uppermost second dielectric layer 601. Before the second redistribution pads 650 are formed, second seed pads 655 may be formed. An electroplating process may be performed in which the second seed pads 650 are used as electrodes to form the second redistribution pads 650. Therefore, a second redistribution substrate 600 may be manufactured. The second redistribution substrate 600 may include the second dielectric layers 601, the second seed patterns 635, the second redistribution patterns 630, the second seed pads 655, and the second redistribution pads 650.

The first carrier substrate 900 may be removed to expose a bottom surface 101*b* of the first redistribution substrate 100. For example, there may be exposed a bottom surface of a lowermost first dielectric layer 101 and bottom surfaces of the under-bump patterns 120.

External connection terminals 500 may be correspondingly formed on the bottom surfaces of the under-bump patterns 120 to be coupled to the under-bump patterns 120. Through the processes described above, a semiconductor package 10 may be eventually fabricated.

The following provides a description of a single semiconductor package 10, but a method of fabricating a semiconductor package is not limited to a chip-level fabrication embodiments. For example, the semiconductor package 10 may be fabricated at a chip, panel, or wafer level.

According to embodiments of the present inventive concepts, a semiconductor package may include a substrate, a first semiconductor chip including a through via on the substrate, a second semiconductor chip on the first semiconductor chip, and a conductive post through which the second semiconductor chip is connected to the substrate. A width of the conductive post may be greater than that of the through via. In addition, the conductive post may directly connect the substrate and the second semiconductor chip to each other without passing through the first semiconductor chip. Therefore, a voltage may be favorably supplied to the second semiconductor chip, compared to an example where a voltage is supplied to the second semiconductor chip through the through via of the first semiconductor chip. Accordingly, the semiconductor package may provide improved electrical properties.

Moreover, the first semiconductor chip and the second semiconductor chip may be connected through direct contact, with no connection terminal, such as bumps, between pads of the first and second semiconductor chips. Furthermore, the second semiconductor chip and the conductive post may be connected through direct contact, with no connection terminal, between the conductive post and the pad of the second semiconductor chip. Thus, a voltage supply path between the first semiconductor chip, the second semiconductor chip, and a first redistribution substrate may have a reduced length, and accordingly the semiconductor package may have improved electrical properties.

This detailed description of embodiments of the present inventive concepts should not be construed as limited to the embodiments set forth herein, and it is intended that the present inventive concepts cover the various combinations, the modifications and variations of different embodiments without departing from the spirit and scope of the present inventive concepts.

What is claimed is:

1. A semiconductor package, comprising:

a substrate;

a first semiconductor chip on the substrate, wherein the first semiconductor chip includes a through via in the first semiconductor chip and a plurality of first bonding pads on an upper portion of the first semiconductor chip;

a second semiconductor chip on the first semiconductor chip, wherein the second semiconductor chip includes a plurality of second bonding pads on a lower portion of the second semiconductor chip;

a conductive post between a top surface of the substrate and a bottom surface of the second semiconductor chip and laterally spaced apart from the first semiconductor chip; and a bump structure below the first semiconductor chip where the bottom surface of the substrate provides a base reference plane, wherein the bump structure includes:

a bump pad below the conductive post and below the through via where the bottom surface of the substrate provides the base reference plane;

a barrier pattern in contact with a bottom surface of the bump pad; and a bonding pattern and a solder bump that are sequentially provided in a downward direction below the barrier pattern where the bottom surface of the substrate provides the base reference plane, wherein the first bonding pads are in contact with the second bonding pads, and wherein a width in a first direction parallel to a plane defined by a bottom surface of the substrate of the second semiconductor chip is greater than a width in the first direction of the first semiconductor chip.

2. The semiconductor package of claim 1, wherein:

the first semiconductor chip further includes a first passivation layer on the upper portion of the first semiconductor chip, the first passivation layer extending along lateral surfaces of the first bonding pads, the second semiconductor chip further includes a second passivation layer on the lower portion of the second semiconductor chip, the second passivation layer extending along lateral surfaces of the second bonding pads, and a top surface of the first passivation layer is in contact with a bottom surface of the second passivation layer.

3. The semiconductor package of claim 1, further comprising a third bonding pad coupled to the conductive post and spaced apart in the first direction from the first semiconductor chip, wherein the second semiconductor chip further includes a fourth bonding pad on the lower portion of the second semiconductor chip, the fourth bonding pad vertically overlapping the conductive post in a second direction perpendicular to the plane defined by the bottom surface of the substrate, and wherein the third bonding pad and the fourth bonding pad are in contact with each other.

4. The semiconductor package of claim 1, further comprising a passive element mounted on a bottom surface of the substrate, wherein the conductive post vertically overlaps at least a portion of the passive element in a second direction perpendicular to the plane defined by the bottom surface of the substrate.

5. The semiconductor package of claim 1, wherein:

the through via has a first width in the first direction, the conductive post has a second width in the first direction, and the second width is greater than the first width.

6. The semiconductor package of claim 1, further comprising a first molding layer on a sidewall of the first semiconductor chip, a sidewall of the second semiconductor chip, and a sidewall of the conductive post, wherein a top surface of the first molding layer is coplanar with a top surface of the second semiconductor chip.

7. The semiconductor package of claim 6, further comprising:

a connection structure on the substrate and spaced apart in the first direction from the first molding layer; and a second molding layer on a sidewall of the connection structure and a sidewall of the first molding layer.

8. The semiconductor package of claim 1, further comprising a connection substrate including a through hole, wherein the connection substrate includes:

a base layer;

a vertical structure that extends into the base layer;

an upper connection pad on a top surface of the vertical structure; and a lower connection pad on a bottom surface of the vertical structure, wherein, when viewed in plan, the first semiconductor chip and the second semiconductor chip are in the through hole.

9. A semiconductor package, comprising:

a substrate;

a first semiconductor chip on the substrate and including a through via in the first semiconductor chip, the first semiconductor chip having a first width in a first direction;

a second semiconductor chip on the first semiconductor chip, the second semiconductor chip having a second width in the first direction;

a first molding layer that surrounds the first semiconductor chip in a plan view;

a second molding layer that surrounds the second semiconductor chip in the plan view; and a lower redistribution layer below the first semiconductor chip, wherein the lower redistribution layer includes:

a lower dielectric layer;

a plurality of lower redistribution patterns in the lower dielectric layer; and a first lower redistribution pad and a second lower redistribution pad that are electrically connected to the lower redistribution patterns, wherein the first lower redistribution pad is coupled to the through via through one of the lower redistribution patterns, wherein the second lower redistribution pad is coupled to a conductive post through another of the lower redistribution patterns, wherein the second width is greater than the first width, and wherein a portion of a top surface of the first molding layer is in contact with an entirety of a bottom surface of the second molding layer.

10. The semiconductor package of claim 9, wherein:

the top surface of the first molding layer is coplanar with a top surface of the first semiconductor chip, and the bottom surface of the second molding layer is coplanar with a bottom surface of the second semiconductor chip.

11. The semiconductor package of claim 9, wherein a sidewall of the first molding layer is linearly aligned with a sidewall of the second molding layer.

12. The semiconductor package of claim 9, further comprising a third molding layer on a sidewall of the first molding layer and on a sidewall of the second molding layer, wherein the third molding layer is further on at least a portion of a bottom surface of the first semiconductor chip and on at least a portion of a top surface of the second semiconductor chip.

13. The semiconductor package of claim 9, further comprising the conductive post on the substrate and spaced apart in the first direction from the first semiconductor chip, the first direction being parallel to a bottom surface of the substrate, wherein the conductive post vertically overlaps a portion of the second semiconductor chip in a second direction perpendicular to the bottom surface of the substrate.

14. The semiconductor package of claim 13, further comprising a bump structure below the first semiconductor chip where the bottom surface of the substrate provides a base reference plane, wherein the bump structure includes:

a bump pad below the conductive post and below the through via where the bottom surface of the substrate provides the base reference plane;

a barrier pattern in contact with a bottom surface of the bump pad; and a bonding pattern and a solder bump that are sequentially provided in a downward direction below the barrier pattern where the bottom surface of the substrate provides the base reference plane.

15. A semiconductor package, comprising:

a first redistribution substrate that includes a first dielectric layer, a first seed pattern, and a first conductive pattern on the first seed pattern, wherein the first dielectric layer includes a photo-imageable polymer;

a solder ball on a bottom surface of the first redistribution substrate;

a first semiconductor chip on a top surface of the first redistribution substrate and including a plurality of through vias in the first semiconductor chip, wherein the first semiconductor chip includes a plurality of first bonding pads on an upper portion of the first semiconductor chip;

a conductive post on the top surface of the first redistribution substrate and laterally spaced apart from the first semiconductor chip;

a second semiconductor chip on a top surface of each of the first semiconductor chip and the conductive post and coupled to the through vias and the conductive post, wherein the second semiconductor chip includes a plurality of second bonding pads on a lower portion of the second semiconductor chip;

a connection structure on the top surface of the first redistribution substrate and laterally spaced apart from the conductive post, the first semiconductor chip, and the second semiconductor chip;

a first molding layer on the top surface of the first redistribution substrate, wherein the first molding layer is on sidewalls of the connection structure and surrounds the first semiconductor chip and the second semiconductor chip in a plan view; and a second redistribution substrate on the first molding layer and the connection structure, wherein the second redistribution substrate is coupled to the connection structure, wherein the first bonding pads are in contact with the second bonding pads, and wherein a width in a first direction of the second semiconductor chip is greater than a width in the first direction of the first semiconductor chip, the first direction being parallel to the bottom surface of the first redistribution substrate.

16. The semiconductor package of claim 15, further comprising an upper package mounted on the second redistribution substrate, wherein the upper package includes an upper semiconductor chip and an upper molding layer, wherein the upper semiconductor chip includes an upper chip pad on a lower portion of the upper semiconductor chip.

* * * * *